United States Patent
Hariya et al.

(10) Patent No.: US 11,646,667 B2
(45) Date of Patent: May 9, 2023

(54) CURRENT DETECTION CIRCUIT, POWER CONVERSION DEVICE, AND POWER SYSTEM

(71) Applicant: TDK CORPORATION, Tokyo (JP)

(72) Inventors: Akinori Hariya, Tokyo (JP); Kenji Negoro, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/487,736

(22) Filed: Sep. 28, 2021

(65) Prior Publication Data

US 2022/0103079 A1    Mar. 31, 2022

(30) Foreign Application Priority Data

Sep. 30, 2020   (JP) .............................. JP2020-164677

(51) Int. Cl.
| | | |
|---|---|---|
| H02M 3/335 | (2006.01) | |
| H02H 7/04 | (2006.01) | |
| H02M 3/155 | (2006.01) | |
| G01R 15/18 | (2006.01) | |
| G01R 19/00 | (2006.01) | |

(52) U.S. Cl.
CPC ........ *H02M 3/33569* (2013.01); *G01R 15/18* (2013.01); *G01R 19/0092* (2013.01); *H02M 3/33515* (2013.01); *H02H 7/042* (2013.01); *H02M 3/155* (2013.01); *H02M 3/33523* (2013.01)

(58) Field of Classification Search
CPC ... H02M 3/155; H02M 3/33523; H02H 7/042
See application file for complete search history.

(56) References Cited

U.S. PATENT DOCUMENTS

| | | | | |
|---|---|---|---|---|
| 5,923,548 A | * | 7/1999 | Kammiller | ........ H02M 7/53871 363/56.03 |
| 2003/0048648 A1 | | 3/2003 | Lin et al. | |
| 2016/0161530 A1 | * | 6/2016 | Lee | ..................... H02M 1/0009 324/127 |

FOREIGN PATENT DOCUMENTS

| | | |
|---|---|---|
| CN | 1514253 A | 7/2004 |
| JP | 2003-219641 A | 7/2003 |
| JP | 2006-149009 A | 6/2006 |
| JP | 2015202031 A * | 11/2015 |

OTHER PUBLICATIONS

Feb. 22, 2022 extended Search Report issued in European Patent Application No. 21199137.7.

* cited by examiner

*Primary Examiner* — Gary A Nash
(74) *Attorney, Agent, or Firm* — Oliff PLC

(57) ABSTRACT

A current detection circuit capable of compensating for detection accuracy of a switching current through switching of a connection state of a resistor even when the switching current has a component in a direction opposite to a predetermined direction is provided. A current detection circuit for detecting a value of a component in a predetermined direction of a switching current using a current transformer, wherein, when the switching current flowing in a primary side of the current transformer has a component in a direction opposite to the predetermined direction, a connection state of reset elements on a secondary side of the current transformer is switched such that an impedance of a magnetic reset on the secondary side of the current transformer is decreased.

15 Claims, 13 Drawing Sheets

CURRENT DETECTION CIRCUIT, POWER CONVERSION DEVICE, AND POWER SYSTEM

BACKGROUND OF THE INVENTION

Field of the Invention

The present disclosure relates to a current detection circuit, a power conversion device, and a power system.

Priority is claimed on Japanese Patent Application No. 2020-164677, filed Sep. 30, 2020, the content of which is incorporated herein by reference.

Description of Related Art

In a power conversion device such as a direct current (DC)-DC converter, a current detection circuit that detects a value corresponding to a switching current is known.

Patent Document 1 describes a technology in which, even when a current under detection flows in an opposite direction, both terminals of a current detection diode connected in series with a current detection resistor on the secondary side of a current transformer are short-circuited by a MOS type FET, so that an impedance on the secondary side of the current transformer is decreased and an exciting current hardly flows through the current transformer (see Patent Document 1).

Patent Document 2 describes a technology in which, in a synchronous rectification type DC-DC converter, a reset resistor, a series circuit of a diode and a switch, and a series circuit of a detection diode and a load are included in parallel between both terminals of a secondary side winding of a current transformer, so that the current transformer is prevented from being excessively excited (see Patent Document 2).

PATENT DOCUMENTS

[Patent Document 1] Japanese Unexamined Patent Application, First Publication No. 2003-219641
[Patent Document 2] Japanese Unexamined Patent Application, First Publication No. 2006-149009

SUMMARY OF THE INVENTION

However, in the technology described in Patent Document 1, when the current under detection flows in the opposite direction, a waveform of the current detection resistor is detected with such a current in the opposite direction as a negative potential and thus, for example, there are problems in that a negative voltage is applied to an input of a control IC and current detection accuracy is insufficient.

Further, in the technology described in Patent Document 2, a series circuit of a diode and a switch is used, and a diode that realizes required characteristics is indispensable. Further, in the technology described in Patent Document 2, a switch of a current detection unit and a main switch of the DC-DC converter are subjected to PWM control by a common control signal at the same timing, but simultaneous driving may be difficult and current detection accuracy may be insufficient, for example, due to a difference in a gate capacity between these switches.

The present disclosure has been made in consideration of such circumstances, and an object of the present disclosure is to provide a current detection circuit, a power conversion device, and a power system capable of compensating detection accuracy of a switching current through switching of a connection state of a resistor even when the switching current has a component in a direction opposite to a predetermined direction.

SUMMARY OF THE INVENTION

An aspect of the present disclosure is a current detection circuit for detecting the value of a component in a predetermined direction of a switching current using a current transformer, wherein, when the switching current flowing in a primary side of the current transformer has a component in a direction opposite to the predetermined direction, a connection state of reset elements on a secondary side of the current transformer is switched such that an impedance of a magnetic reset on the secondary side of the current transformer is decreased.

An aspect of the present disclosure is a power conversion device including: a main circuit configured to supply an output voltage using the switching current; and the current detection circuit.

An aspect of the present disclosure is a power system including a power conversion device.

According to the current detection circuit, the power conversion device, and the power system according to the present disclosure, it is possible to compensate detection accuracy of a switching current through switching of a connection state of a resistor even when the switching current has a component in a direction opposite to a predetermined direction.

DETAILED DESCRIPTION OF THE INVENTION

Hereinafter, embodiments of the present disclosure will be described with reference to the drawings.

[Power Conversion Device]

Figure 1:
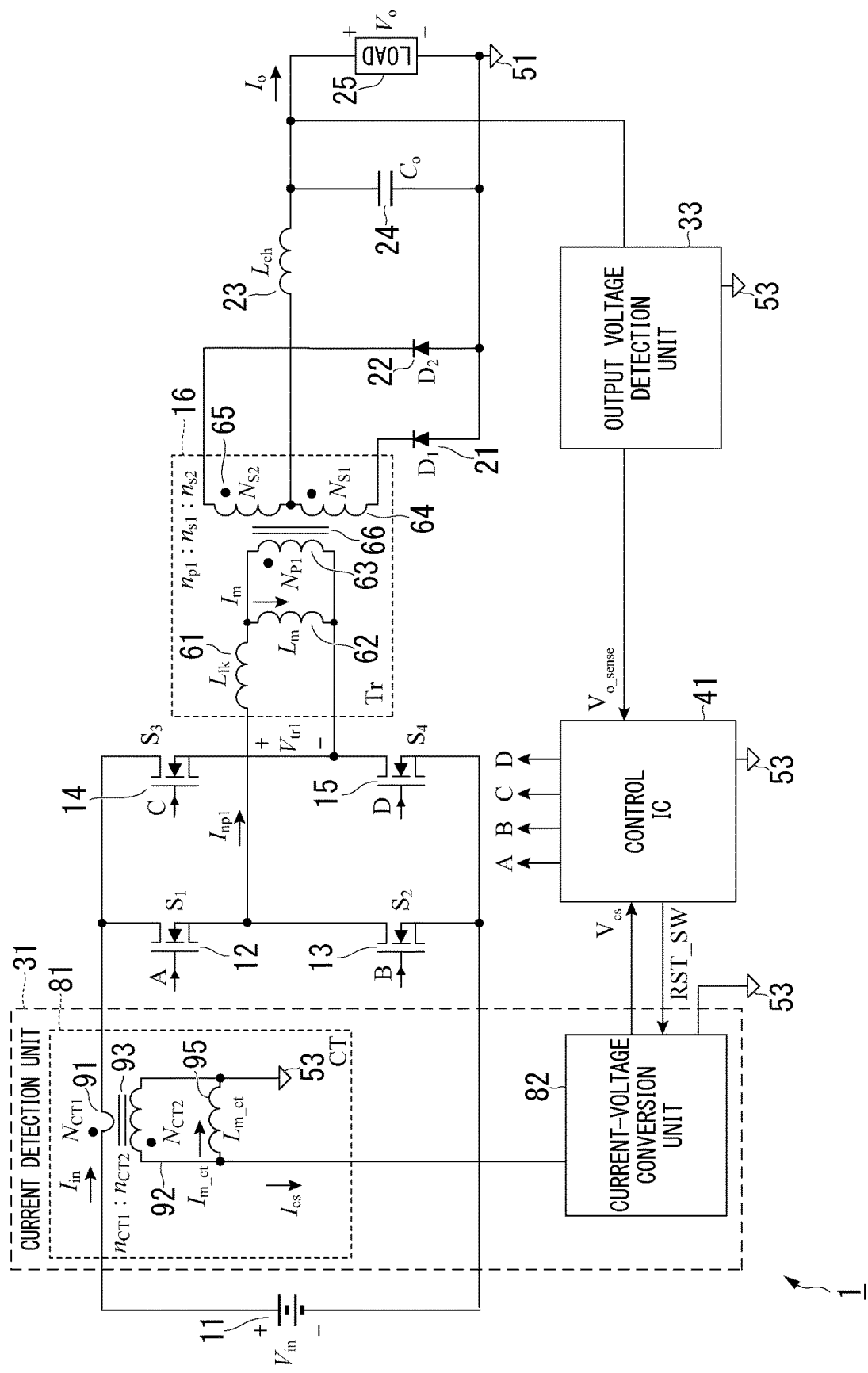
FIG. 1 is a diagram illustrating a configuration of a power conversion device according to an embodiment.

FIG. 1 is a diagram illustrating a configuration of a power conversion device 1 according to an embodiment. In the present embodiment, the power conversion device 1 has a function of a DC-DC converter.

The power conversion device 1 includes, for example, a DC power supply 11 that is a battery, four FETs 12 to 15 (switch elements A, B, C, and D) that are each metal oxide semiconductor (MOS)-field effect transistors (FETs), a transformer 16 (trans Tr), two rectification diodes 21 and 22 (rectification diodes $D_1$ and $D_2$), a choke coil 23 (choke coil $L_{ch}$), an output capacitor 24 (output capacitor $C_o$), a load 25 that is, for example, a battery or any of various electronic devices, a current detection unit 31 including a current detection circuit, an output voltage detection unit 33, and a control integrated circuit (IC) 41.

The transformer 16 includes a leakage inductor 61, an excitation inductor 62, a primary side winding 63 (primary side winding $N_{p1}$), two secondary side windings 64 and 65 (secondary side winding $N_{s1}$ and secondary side winding $N_{s2}$), and a core 66 as an equivalent circuit.

The current detection unit 31 includes a current transformer 81 (current transformer CT) and a current-voltage conversion unit 82.

The current transformer 81 includes a primary side winding 91 (primary side winding $N_{CT1}$), a secondary side winding 92 (secondary side winding $N_{CT2}$), and a core 93 and includes an excitation inductor 95 as an equivalent circuit.

A ground terminal 51 and a ground terminal 53 represent terminals having a reference potential.

In the present embodiment, the reference potential is ground (GND). Further, in the present embodiment, the ground terminal 51 and the ground terminal 53 may be common.

In the present embodiment, the power conversion device 1 converts a DC voltage $V_{in}$ supplied from the DC power supply 11 into a DC voltage Vo and supplies power thereof to the load 25.

A full bridge circuit including four FETs 12 to 15 generates a primary side transformer voltage $V_{tr1}$ from the DC voltage $V_{in}$.

The transformer 16 converts the primary side transformer voltage $V_{tr1}$ generated by the full bridge circuit into a secondary side transformer voltage with a turns ratio of $n_{p1}:n_{s1}:n_{s2}$ and transfers the secondary side transformer voltage.

Here, the turn ratio is a ratio of turns of the primary side winding 63, the secondary side winding 64, and a secondary side winding 65.

The transformer 16 includes the leakage inductor 61 (a leakage inductor $L_{lk}$) and the excitation inductor 62 (an excitation inductor $L_m$) provided therein.

The two rectification diodes 21 and 22 generate a DC voltage from the secondary transformer voltage (secondary AC voltage).

The choke coil 23 and the output capacitor 24 smooth the rectified DC voltage. A load current $I_o$ flows through the load (LOAD) 25, and an output voltage $V_o$ is applied to both terminals of the load 25.

Here, among connection terminals of the load (LOAD) 25, a side opposite to the choke coil 23 is connected to the ground terminal 51.

Further, among anodes of the two rectification diodes 21 and 22 and connection terminals of the output capacitor 24, a side opposite to the choke coil 23 is connected to the ground terminal 51.

In the present embodiment, power conversion is performed in a configuration in which an inverter unit is a full bridge circuit, a rectification unit on the secondary side is a center tap rectification circuit, and phase shift control is used.

The configuration in which power conversion is performed is not limited thereto, and various other configurations may be used. For example, control using pulse width modulation (PWM), pulse frequency modulation (PFM), or the like may be used instead of the phase shift control. Further, for example, a half-bridge circuit or the like may be used instead of the full bridge circuit.

There are four operation modes depending on states of the four FETs 12 to 15. Mode 1 is a mode when the FET 12 and the FET 15 are in an ON state and the FET 13 and the FET 14 are in an OFF state. In this case, the transformer 16 transmits power from the primary side to the secondary side.

Mode 2 is a mode when the FET 12 and the FET 14 are in an ON state and the FET 13 and the FET 15 are in an OFF state. In this case, current return occurs on the primary side of the transformer 16.

Mode 3 is a mode when the FET 13 and the FET 14 are in the ON state and the FET 12 and the FET 15 are in the OFF state. In this case, the transformer 16 transmits power from the primary side to the secondary side.

Mode 4 is a mode when the FET 13 and the FET 15 are in the ON state and the FET 12 and the FET 14 are in the OFF state. In this case, current return occurs on the primary side of the transformer 16.

After an operation from mode 1 to mode 4 has ended, return to mode 1 occurs again, and the operation from mode 1 to mode 4 is repeated.

In each mode, an AC component in a current flowing through the choke coil 23 flows through the output capacitor 24.

In the present embodiment, ON and OFF of each of the four FETs 12 to 15 is controlled under the control of the control IC 41, an on-duty width of the semiconductor switching element is adjusted, and as a result, a time ratio of a power transmission time is adjusted so that a desired output voltage is obtained.

The current detection unit 31 detects a primary side input current $I_{in}$.

In the current detection unit 31, the current transformer 81 converts the primary side input current $I_{in}$ into the current under detection $I_{cs}$ at a turns ratio of $n^{CT1}:n_{CT2}$.

Here, the turns ratio is a ratio of turns of the primary side winding 91 and the secondary side winding 92. In general, in the current transformer 81, the number of turns $n_{CT1}$ of the primary side winding 91 is smaller and the number of turns $n_{CT2}$ of the secondary side winding 92 is larger. As a specific example, the number of turns $n_{CT1}$ of the primary side winding 91 is 1, and the number of turns $n_{CT2}$ of the secondary side winding 92 is 100, but the present invention is not limited thereto.

One end of the secondary side winding 92 is connected to the ground terminal 53.

The current transformer 81 includes the excitation inductor 95 (an excitation inductor $L_{m\_ct}$) provided therein.

In the current detection unit 31, the current-voltage conversion unit 82 converts the current $I_{cs}$ under detection into a detection voltage $V_{cs}$, which is a voltage that can be read by the control IC 41.

The output voltage detection unit 33 converts the output voltage $V_o$ into a voltage $V_{o\_sense}$ that can be read by the control IC 41.

The control IC 41 is, for example, a microcomputer or a digital signal processor (DSP).

The control IC 41 receives the detection voltage $V_{cs}$ obtained by the current-voltage conversion unit 82 of the current detection unit 31 and the voltage $V_{o\_sense}$ obtained by the output voltage detection unit 33 and controls an operation of each unit on the basis of values of these voltages.

For example, the control IC 41 outputs a reset signal RST_SW for controlling a reset unit of the current transformer 81 to the current-voltage conversion unit 82.

Further, the control IC 41 outputs a signal for controlling ON and OFF of each of the FETs 12 to 15 to a gate of each of the FETs 12 to 15 via a driver (not illustrated) included in each drive system. Hereinafter, description of the driver will be omitted.

Figure 2:
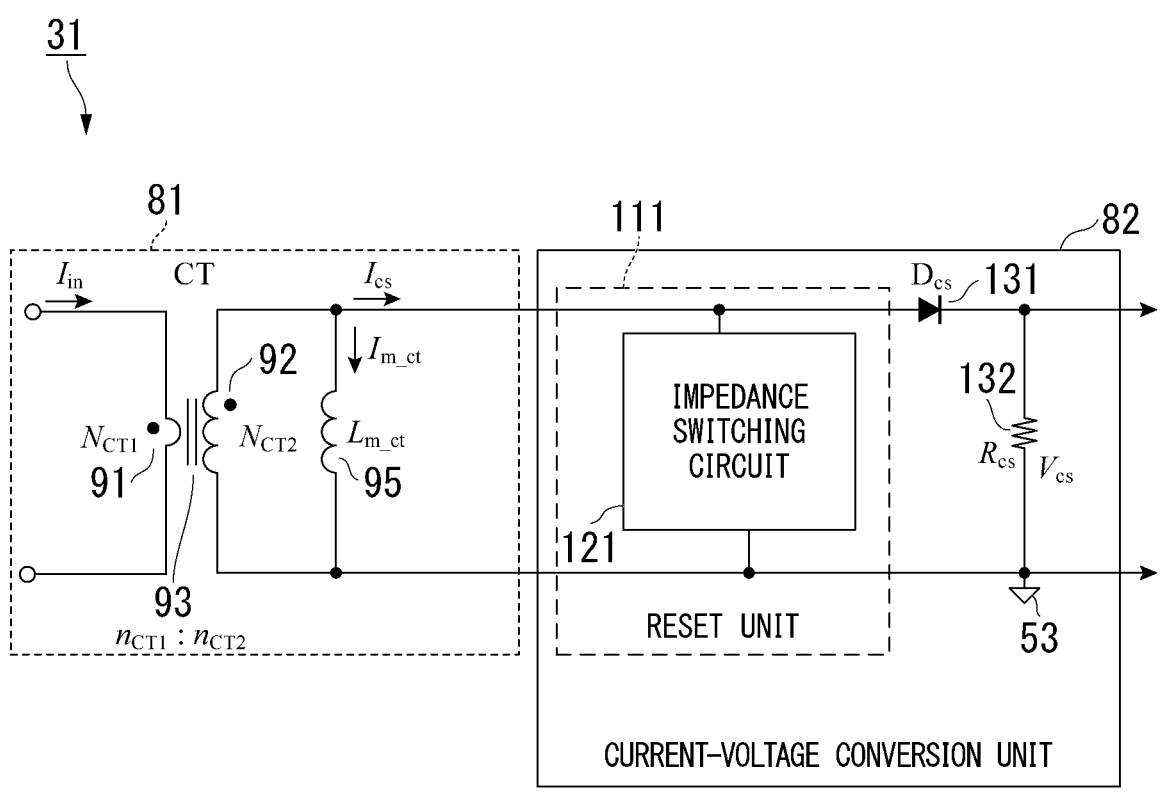
FIG. 2 is a diagram illustrating a schematic configuration of a current detection unit according to an embodiment.

FIG. 2 is a diagram illustrating a schematic configuration of the current detection unit 31 according to the present embodiment. In FIG. 2, the current transformer 81 is also illustrated.

The current-voltage conversion unit 82 includes a reset unit 111 of the current transformer 81, a detection diode 131 (a detection diode $D_{cs}$), and a detection resistor 132 (a detection resistor $R_{cs}$).

The detection diode 131 (the detection diode $D_{cs}$) is a diode that sets a current detection direction and is described as a detection diode in the present specification because of its function.

The reset unit 111 includes an impedance switching circuit 121.

The detection diode 131 and the detection resistor 132 are connected in order in series to the current transformer 81.

In the case of the present embodiment, the current transformer 81 and an anode of the detection diode 131 are connected to each other, and a cathode of the detection diode 131 and the detection resistor 132 are connected to each other. Among connection terminals of the detection resistor 132, a side opposite to the detection diode 131 is connected to a ground terminal 53. The ground terminal 53 represents an end portion having a reference potential (ground in the present embodiment) and is common to a ground terminal of the current transformer 81.

Connection polarities of the detection diode 131 are disposed in a direction in which the detection diode 131 conducts when the current $I_{cs}$ under detection flows in a positive direction (forward direction). In the present embodiment, the detection diode 131 is disposed in a direction in which a cathode is connected to the control IC 41 on the detection signal line side on the non-ground terminal side. On the other hand, the detection diode 131 may be on a line on the ground terminal 53 side. In this case, the detection diode 131 is disposed in a direction in which an anode is connected to the control IC 41. The detection resistor 132 converts the current $I_{cs}$ under detection into the detection voltage $V_{cs}$ to detect the detection voltage $V_{cs}$.

The impedance switching circuit 121 can variably switch impedance of the reset unit 111.

In the present embodiment, the impedance switching circuit 121 functions to decrease the impedance during a period in which the primary side input current $I_{in}$ flows in both positive and negative directions and a current flows in the negative direction, as compared with a case in which the primary side input current $I_{in}$ is a current flowing in the positive direction in all the periods.

In the present embodiment, a direction in which the primary side input current $I_{in}$ flows from the DC power supply 11 to the transformer 16 is the positive direction, and a direction opposite to the positive direction is the negative direction.

Here, a circuit configuration of the impedance switching circuit 121 and a configuration for controlling the impedance switching circuit 121 may be arbitrary, and specific examples thereof will be shown below.

First Embodiment

Figure 3:
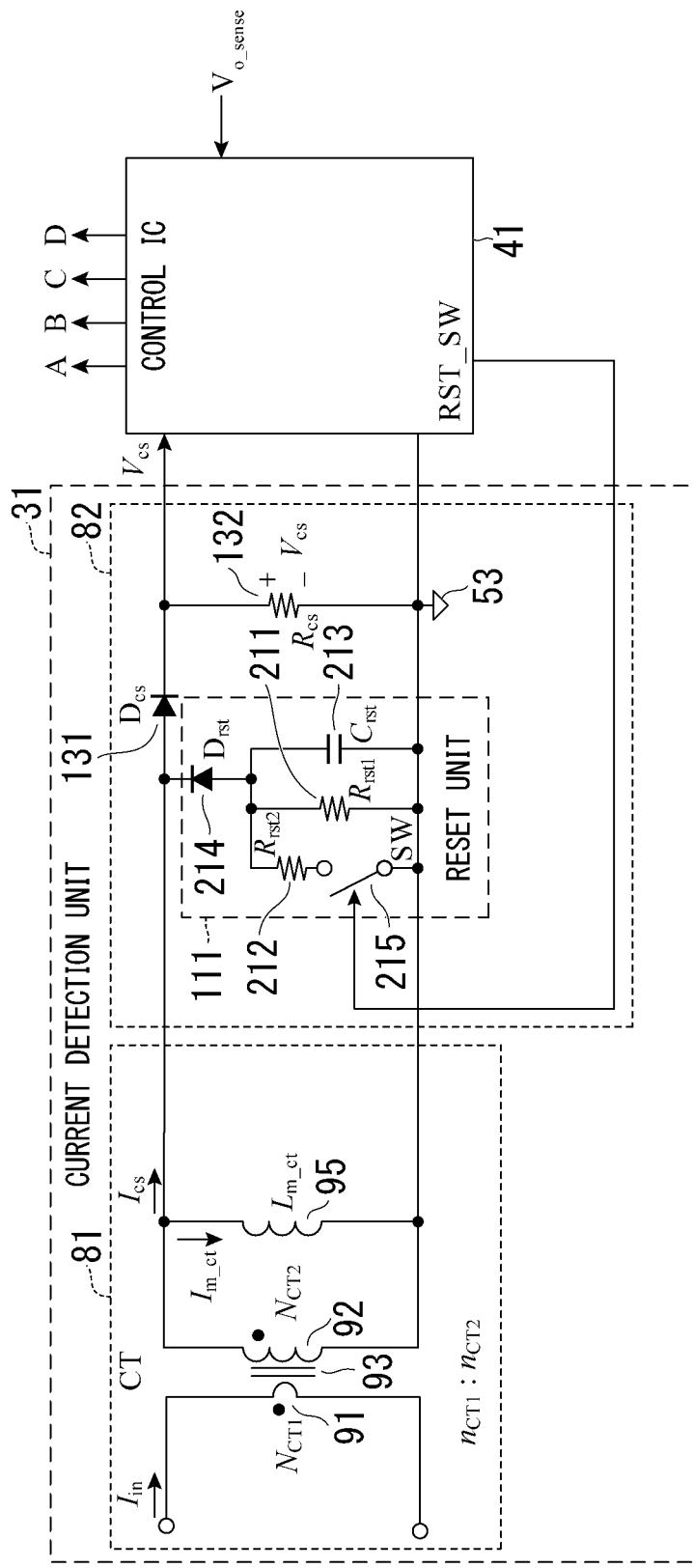
FIG. 3 is a diagram illustrating a configuration of a current detection unit according to a first embodiment.

FIG. 3 is a diagram illustrating a configuration of the current detection unit 31 according to the first embodiment.

In FIG. 3, the current transformer 81 and the control IC 41 are also illustrated.

The detection voltage $V_{cs}$ detected by the current detection unit 31 is output to the control IC 41.

The control IC 41 outputs a reset signal RST_SW of the current transformer 81 to the current detection unit 31.

A circuit configuration example of the impedance switching circuit 121 of the reset unit 111 is shown.

The reset unit 111 includes a first reset resistor 211 (first reset resistor $R_{rst1}$), a second reset resistor 212 (second reset resistor $R_{rst2}$), a reset capacitor 213 (reset capacitor $C_{rst}$), a reset diode 214 (reset diode $D_{rst}$), and a switch element 215 (switch SW), as the impedance switching circuit 121.

A series circuit of the switch element 215 and the second reset resistor 212, the first reset resistor 211, and the reset capacitor 213 are connected in parallel. A parallel connection circuit thereof and the reset diode 214 are connected in series and connected to both terminals of the secondary side winding 92 of the current transformer 81.

In the present embodiment, the parallel connection circuit is connected to an anode of the reset diode 214. A cathode of the reset diode 214 is connected to the anode of the detection diode 131.

Among connection terminals of the parallel connection circuit, a side opposite to the reset diode 214 is connected to the ground terminal 53.

The reset diode 214 is connected in a direction in which the switching current blocks a current flowing in a predetermined direction. In the present embodiment, the switch element 215 is set in a non-conducting state when the switching current is the current flowing in the predetermined direction, and the switch element 215 is set in a conducting state when the switching current is a current also flowing in a direction opposite to the predetermined direction.

A series connection relationship of the parallel connection circuit and the reset diode 214 may be reversed in order.

Further, when the detection diode 131 is disposed on the line on the ground terminal 53 side, the anode side of the reset diode 214 is connected to the cathode of the detection diode 131 conversely.

Hereinafter, description will be given under condition that the detection diode 131 is disposed in a direction in which the cathode is connected to the control IC 41 on the detection signal line side on the non-ground terminal side, and the anode of the detection diode 131 and the cathode of the reset diode 214 are directly connected to each other.

The switch element 215 is controlled by the reset signal RST_SW output from the control IC 41.

In a state in which the switch element 215 is OFF, for the first reset resistor 211 and the second reset resistor 212, the reset diode 214 and the first reset resistor 211 are connected in series between the anode of the detection diode 131 and the ground terminal 53 in a direction in which the cathode of the reset diode 214 is connected to the anode of the detection diode 131.

On the other hand, in a state in which the switch element 215 is ON, for the first reset resistor 211 and the second reset resistor 212, the reset diode 214 and a circuit in which the first reset resistor 211 and the second reset resistor 212 are connected in parallel are connected in series between the anode of the detection diode 131 and the ground terminal 53 similarly in a direction in which the cathode of the reset diode 214 is connected to the anode of the detection diode 131.

ON and OFF of the switch element 215 are switched as described above, so that a magnitude of a resistance value of a reset resistor of the reset unit 111 can be switched.

The reset resistor is a resistor that performs magnetic reset of the current transformer 81.

For example, when a resistance value of the second reset resistor 212 is sufficiently smaller than a resistance value of the first reset resistor 211, a combined resistance value of the circuit in which the first reset resistor 211 and the second reset resistor 212 are connected in parallel becomes close to the resistance value of the second reset resistor 212.

In the present embodiment, the resistance value of the second reset resistor 212 is set to be sufficiently smaller than the resistance value of the first reset resistor 211.

As a specific example, the resistance value of the first reset resistor 211 is a high resistance on the order of hundreds of kΩ, and the resistance value of the second reset resistor 212 is a low resistance on the order of several Ω, to several kΩ.

In the present embodiment, in a state in which the primary side current $I_{in}$ is flowing only in the positive direction, the switch element 215 is always turned off, and magnetic reset of the current transformer 81 is performed through the first reset resistor 211, the reset capacitor 213, and the reset diode 214.

In this case, in the present embodiment, the reset capacitor 213 can reduce a voltage applied to both terminals of the switch element 215, so that a switch element with a low withstand voltage can be selected as the switch element 215.

Further, in the present embodiment, the presence of the reset diode 214 prevents discharge from the reset capacitor 213 when the primary side current $I_{in}$ flows in the positive direction.

When there is no reset diode 214 and the primary side current $I_{in}$ flows in the positive direction, discharge of the reset capacitor 213 is performed, which is likely to cause unintended voltage drop of the voltage detected by the detection resistor 132.

On the other hand, in a state in which the load current $I_o$ becomes low and the primary side input current $I_{in}$ flows in both the positive and negative directions, the switch element 215 is switched to the ON state. Accordingly, since the second reset resistor 212 having a low resistance becomes parallel to the first reset resistor 211 having a high resistance, a reset resistance value of a combination of these is substantially equal to the resistance value of the second reset resistor 212. In this case, magnetic reset of the current transformer 81 is substantially performed through the second reset resistor 212, the reset capacitor 213, and the reset diode 214.

In this case, in the present embodiment, the presence of the reset diode 214 allows a current to flow through the second reset resistor 212 only when the primary side current $I_{in}$ has a component flowing in a negative direction.

When there is no reset diode 214, a current flows through the second reset resistor 212 when the primary side current $I_{in}$ has a component flowing in a positive direction, which is likely to cause unintended voltage drop of the voltage detected by the detection resistor 132.

From the above, when the primary side current $I_{in}$ has a component flowing in the negative direction, a voltage generated at both terminals of the secondary side winding 92 of the current transformer 81 is reduced by the second reset resistor 212, and thus it is possible to reduce energy stored in the excitation inductor 95 of the current transformer 81. As a result, it is possible to prevent a voltage waveform of the detection voltage $V_{cs}$ from increasing.

In the present embodiment, the reset unit 111 is configured to include the reset capacitor 213, but a configuration in which the reset capacitor 213 is not included may be used as another configuration example.

Here, the switch element 215 may be, for example, a semiconductor element such as a MOS-FET.

When an N-channel MOS-FET is used as the switch element 215, the reset signal RST_SW is input to a gate of the switch element 215. Further, a source and a drain of the switch element 215 are connected between the second reset resistor 212 and the ground terminal 53. For example, the source of the switch element 215 is connected to the second reset resistor 212, and the drain of the switch element 215 is connected to the ground terminal 53. A P-channel MOS-FET can be adopted as the switch element. In the case of either an N-channel or P-channel MOS-FET, a connection is made in a direction in which polarities of a built-in body diode of the MOS-FET are opposite to polarities of the reset diode 214 between the terminals of the secondary side winding 92 of the current transformer 81.

Figure 4:
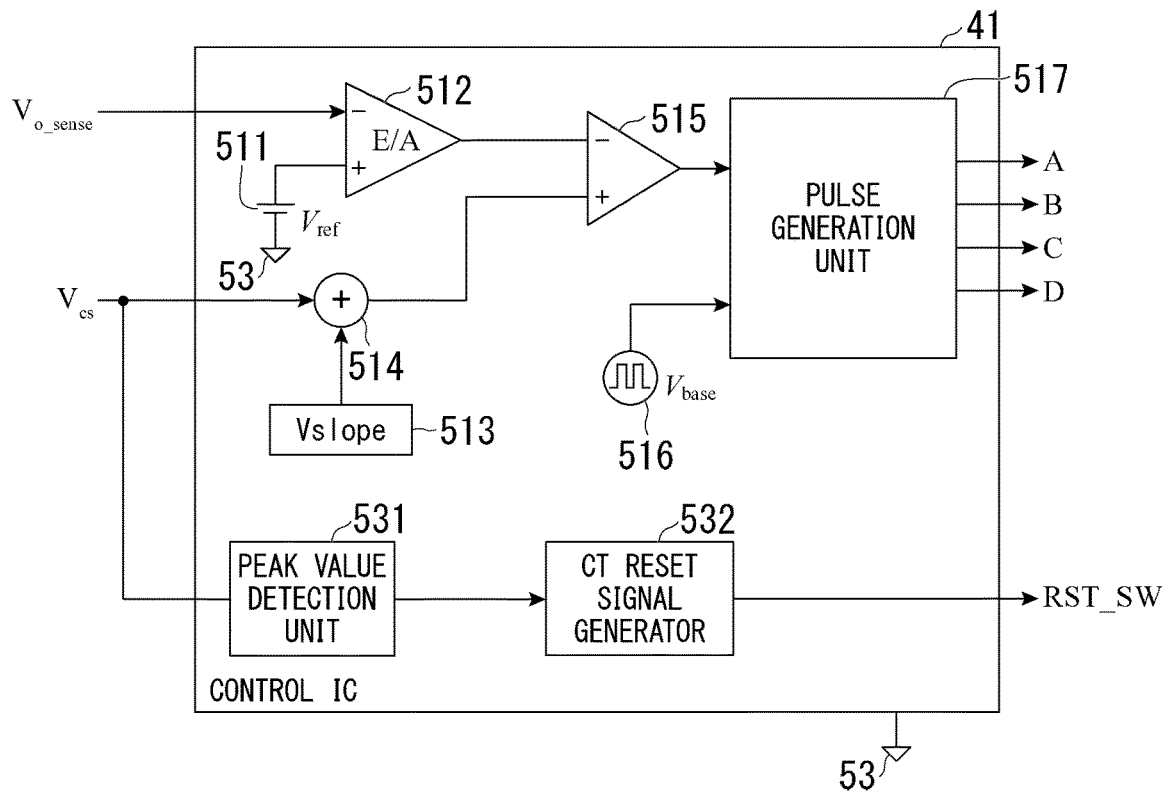
FIG. 4 is a diagram illustrating a configuration of a control IC according to the first embodiment.

FIG. 4 is a diagram illustrating a configuration of the control IC 41 according to the first embodiment.

The control IC 41 includes a reference power supply 511, an error amplifier 512 (E/A), a slope voltage source 513, an adder 514, a comparator 515, a reference pulse generator 516, a pulse generation unit 517, a peak value detection unit 531, and a CT reset signal generator 532.

The error amplifier 512 amplifies a difference between a reference voltage $V_{ref}$ supplied from the reference power supply 511 and the voltage $V_{o\_sense}$ (output voltage sense value).

In the example of FIG. 4, the reference voltage $V_{ref}$ is input to an input terminal on the positive side of the error amplifier 512, and the voltage $V_{o\_sense}$ is input to an input terminal on the negative side of the error amplifier 512.

Here, the negative side of the reference power supply 511 is connected to the ground terminal 53.

The adder 514 adds the detection voltage $V_{cs}$ to a slope compensation voltage $V_{slope}$ supplied from the slope voltage source 513.

The comparator 515 compares the output from the error amplifier 512 with an output from the adder 514.

In the example of FIG. 4, an addition result of the adder 514 is input to an input terminal on the positive side of the comparator 515, and the output from the error amplifier 512 is input to an input terminal on the negative side of the comparator 515.

The pulse generation unit 517 receives an output from the comparator 515 and timing information of a reference pulse $V_{base}$ (reference voltage) output from the reference pulse generator 516, generates a pulse signal that is used for gate drive of each of the FETs 12 to 15 on the basis of these and outputs the pulse signal to the gate of each of the FETs 12 to 15. Accordingly, control of a peak current mode in a main circuit of the power conversion device 1 is performed. As the control of the peak current mode, for example, general control may be performed.

In the example of FIG. 4, the output from the comparator 515 and the reference pulse $V_{base}$ are input to input terminals of the pulse generation unit 517.

In the present embodiment, the main circuit is a circuit that is a target for which a current is detected by the current detection unit 31 and is a part obtained by excluding a circuit of the current detection unit 31 from a circuit of the power conversion device 1.

The detection voltage $V_{cs}$ is input to an input terminal of the peak value detection unit 531.

The peak value detection unit 531 extracts a peak value of the detection voltage $V_{cs}$.

An output from the peak value detection unit 531 is input to an input terminal of the CT reset signal generator 532.

The CT reset signal generator 532 outputs the reset signal RST_SW on the basis of the peak value of the input detection voltage $V_{cs}$.

Figure 5:
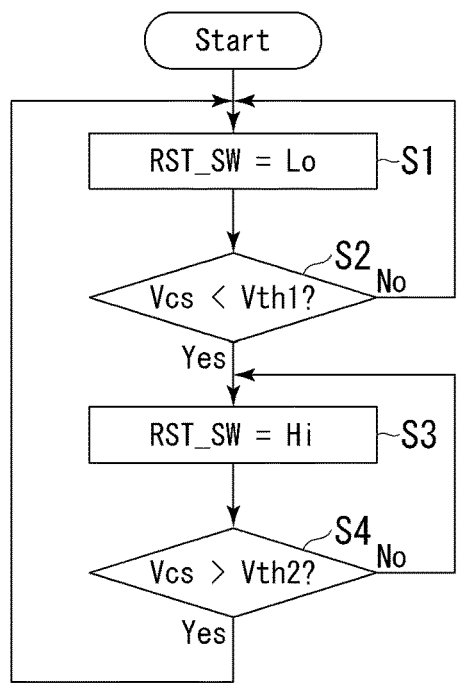
FIG. 5 is a diagram illustrating an example of a procedure of a process of switching a reset signal, which is performed in control according to the first embodiment.

FIG. 5 is a diagram illustrating an example of a procedure of a process of switching the reset signal RST_SW that is performed in the control IC 41 according to the first embodiment.

(Step S1)

In an initial state, in the control IC 41, the CT reset signal generator 532 outputs, for example, the low reset signal RST_SW.

The control IC 41 proceeds to a process of step S2.

(Step S2)

In the control IC 41, when the CT reset signal generator 532 outputs the Lo reset signal RST_SW and the output from the peak value detection unit 531 (peak value of the detection voltage $V_{cs}$) falls below a detection threshold value Vth1 (step S2: YES), the control IC 41 proceeds to step S3.

On the other hand, when this is not the case (step S2: NO), the CT reset signal generator 532 maintains a state in which the Lo reset signal RST_SW is output (step S1).

(Step S3)

In the control IC 41, the CT reset signal generator 532 outputs a Hi reset signal RST_SW.

The control IC 41 proceeds to a process of step S4.

(Step S4)

In the control IC 41, when the CT reset signal generator 532 outputs the Hi reset signal RST_SW and the output from the peak value detection unit 531 (the peak value of the detection voltage $V_{cs}$) exceeds a return threshold value Vth2 (step S4: YES), the control IC 41 proceeds to the process of step S1.

On the other hand, when this is not the case (step S4: NO), the CT reset signal generator 532 maintains a state in which the Hi reset signal RST_SW is output (step S3).

Here, in the present embodiment, the return threshold value Vth2 is larger than the detection threshold value Vth1, that is, the detection threshold value Vth1 and the return threshold value Vth2 are provided with a certain degree of hysteresis width.

The detection threshold value Vth1 is set so that switching of the resistance value of the reset resistor can be performed before the load current decreases from a heavy load state and the primary side input current $I_{in}$ starts to have a component flowing in the negative direction.

The return threshold value Vth2 is set so that switching of the resistance value of the reset resistor can be performed at a timing when the load current increases from the light load state and the primary side input current $I_{in}$ starts to flow only in the positive direction.

With these settings, it becomes possible to switch the resistance value of the reset resistor depending on a current detection value and to prevent the detection voltage $V_{cs}$ at the time of a light load from increasing.

The detection threshold value Vth1 and the return threshold value Vth2 may be set to various values.

Further, in the present embodiment, hysteresis is provided in the detection threshold value Vth1 and the return threshold value Vth2, but as another example, the detection threshold value Vth1 and the return threshold value Vth2 may be the same value.

In the present embodiment, when the output from the peak value detection unit 531 (peak value of the detection voltage $V_{cs}$) exceeds the detection threshold value Vth1, a determination is made that no negative current flows and a low (Lo) signal is output as the reset signal RST_SW output from the control IC 41, and when the output falls below the detection threshold value Vth1, a determination is made that a negative current is flowing, and a high (Hi) signal is output as the reset signal RST_SW output from the control IC 41.

Therefore, in the present embodiment, when the reset signal RST_SW is a Lo signal, the switch element 215 is turned off. As a result, the switch element 215 in an OFF state and the first reset resistor 211 are connected in parallel, and a resistance value of the combined reset resistor is substantially equal to the resistance value of the first reset resistor 211.

On the other hand, when the reset signal RST_SW is a Hi signal, the switch element 215 is turned on. As a result, the second reset resistor 212 and the first reset resistor 211 are connected in parallel, and in this case, since the resistance value of the second reset resistor 212 is much smaller than the resistance value of the first reset resistor 211, the resistance value of the combined reset resistor becomes substantially equal to the resistance value of the second reset resistor 212.

Figure 6:
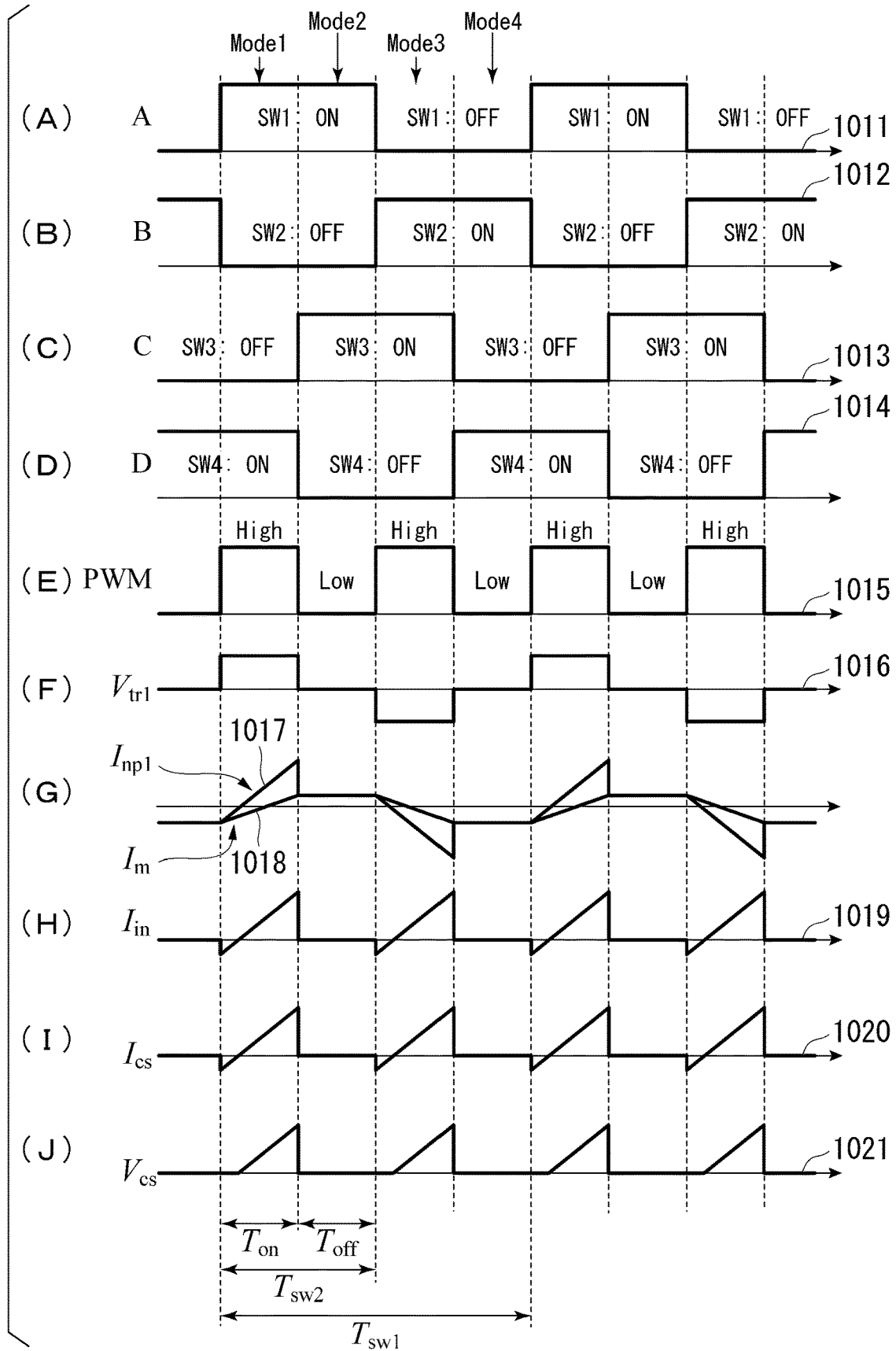
FIG. 6 is a diagram showing lines (A) to (J), which illustrate operation waveforms of respective units according to the first embodiment.

FIG. 6 is a diagram showing lines (A) to (J), which illustrate operation waveforms of the respective units according to the first embodiment.

Line (A) of FIG. 6 illustrates an operation waveform 1011 showing an ON and OFF timing of the FET 12.

Line (B) of FIG. 6 illustrates an operation waveform 1012 showing an ON and OFF timing of the FET 13.

Line (C) of FIG. 6 illustrates an operation waveform 1013 showing an ON and OFF timing of the FET 14.

Line (D) of FIG. 6 illustrates an operation waveform 1014 showing an ON and OFF timing of the FET 15.

Line (E) of FIG. 6 illustrates an operation waveform 1015 of PWM.

Line (F) of FIG. 6 illustrates an operation waveform 1016 of the primary transformer voltage $V_{tr1}$ applied to the transformer 16.

Line (G) of FIG. 6 illustrates an operation waveform 1017 of a primary side transformer current $I_{np1}$ (a switching current) input to the transformer 16 and an operation waveform 1018 of an exciting current $I_m$ flowing through the excitation inductor 62.

Line (H) of FIG. 6 illustrates an operation waveform 1019 of the primary side input current $I_{in}$.

Line (I) of FIG. 6 illustrates an operation waveform 1020 of the current $I_{cs}$ under detection in the current detection unit 31.

Line (J) of FIG. 6 illustrates an operation waveform 1021 of the detection voltage $V_{cs}$ in the current detection unit 31.

In the present embodiment, there are four modes depending on a combination of ON and OFF timings of the four FETs 12 to 15.

Mode 1 is a mode in a period in which both the FET 12 (switch element A: SW1) and the FET 15 (switch element D: SW4) are turned on.

Mode 2 is a mode in a period in which both the FET 12 (switch element A: SW1) and the FET 14 (switch element C: SW3) are turned on.

Mode 3 is a mode in a period in which both the FET 13 (switch element B: SW2) and the FET 14 (switch element C: SW3) are turned on.

Mode 4 is a mode in a period in which both the FET 13 (switch element B: SW2) and the FET 15 (switch element D: SW4) are turned on.

Here, a pulse that becomes high in Mode 1 and Mode 3 and becomes low in Mode 2 and Mode 4 is defined as a PWM pulse.

A length of mode 1 and a length of mode 3 are time $T_{on}$.
A length of mode 2 and a length of mode 4 are time $T_{off}$.
A total value of the time $T_{on}$ and the time $T_{off}$ is time $T_{sw2}$ of one cycle of the PWM.

A total value of periods from mode 1 to mode 4 becomes time $T_{sw1}$ of one cycle of an operation of each switch element.

Here, a time ratio Duty1 and a time ratio Duty2 are defined as follows.

$$Duty1 = T_{sw2}/T_{sw1}$$

$$Duty2 = T_{on}/T_{sw2}$$

In a steady state, Duty1 of each of the four FETs 12 to 14 that determines the ON and OFF timing of the four FETs 12 to 15 is fixed at 50%.

In fact, although it is common that a dead time, which is a minute period in which both the FET 12 (switch element A) and the FET 13 (switch element B), and both the FET 14 (switch element C) and the FET 15 (switch element D) are turned off, is provided between timings of the turn-off of the FET 12 (switch element A) and the turn-on of the FET 13 (switch element B), the turn-on of the FET 12 (switch element A) and the turn-off of the FET 13 (switch element B), the turn-off of the FET 14 (switch element C) and the turn-on of the FET 15 (switch element D), the turn-on of the FET 14 (switch element C) and the turn-off of the FET 15 (switch element D), such a dead time is ignored in description for simplification of the description in the present embodiment.

Duty 2 of the PWM pulse is determined by states of the load current $I_o$ and the input voltage $V_{in}$ in order to control the output voltage $V_o$ into a constant voltage.

When the load current $I_o$ increases, time $T_{on}$ of mode 1 and mode 3 becomes longer and Duty2 becomes larger. Further, when the input voltage $V_{in}$ decreases, time $T_{on}$ of mode 1 and mode 3 becomes longer and Duty2 becomes larger.

In mode 1, when both FET 12 (switch element A: SW1) and FET 15 (switch element D: SW4) are turned on, the input voltage $V_{in}$ is applied to the primary side winding 63 of the transformer 16, a rectification diode 21 conducts, and a power is transferred to the secondary side.

In mode 3, when both the FET 13 (switch element B: SW2) and the FET 14 (switch element C: SW3) are turned on, a negative input voltage ($-V_{in}$) is applied to the primary side winding 63 of the transformer 16, a rectification diode 22 conducts, and a power is transferred to the secondary side.

In mode 2, the primary side current returns through a path of the leakage inductor 61, the primary side winding 63, the FET 14 (switch element C: SW3), the FET 12 (switch element A: SW1), and the leakage inductor 61 due to energy stored in the leakage inductor 61 of the transformer 16.

Further, in mode 4, the primary side current returns through a path of the leakage inductor 61, the FET 13 (switch element B: SW2), the FET 15 (switch element D: SW4), and the primary side winding 63, and the leakage inductor 61 due to the energy stored in the leakage inductor 61 of the transformer 16.

In mode 2 and mode 4, the current of the choke coil 23 flows through both the secondary side winding 64 and the secondary side winding 65, and the two rectification diodes 21 and 22 both conducts.

From this, the input current $I_{in}$ flows in a state of mode 1 in which both the FET 12 (switch element A: SW1) and the FET 15 (switch element D: SW4) are turned on, and a state of mode 3 in which both the FET 13 (switch element B: SW2) and the FET 14 (switch element C: SW3) are turned on.

Here, a case in which the primary side input current $I_{in}$ becomes a current flowing in both the positive and negative directions at the time of a light load of the load current $I_o$ is assumed.

When the primary side transformer current $I_{np1}$ flowing through the primary side winding 63 of the transformer 16 approaches an exciting current $I_m$ of the transformer 16 at a start timing of mode 1 and mode 3, the primary side input current $I_{in}$ has a component flowing in the negative direction. When the primary side input current $I_{in}$ has a component flowing in the negative direction, a current flowing through the secondary side winding 92 of the current transformer 81 has a component flowing in the negative direction (that is, the current $I_{cs}$ under detection has a component flowing in the negative direction), the reset diode 214 conducts, and a current flows through the first reset resistor 211, the second reset resistor 212, and the reset capacitor 213.

In the present embodiment, since the voltage generated at both terminals of the second reset resistor 212 in the current detection unit 31 is decreased, the energy stored in the excitation inductor 95 of the current transformer 81 is also decreased. As a result, since the exciting current $I_{m\_ct}$ of the current transformer 81 hardly flows, there is no dependence on the exciting current $I_{m\_ct}$ of the current transformer 81 and the waveform of the detection voltage $V_{cs}$ detected by the detection resistor $R_{cs}$ includes only the positive side, as illustrated in line (J) of FIG. 6 even when the primary side input current $I_{in}$ becomes a current flowing in both the positive and negative directions.

Figure 7:
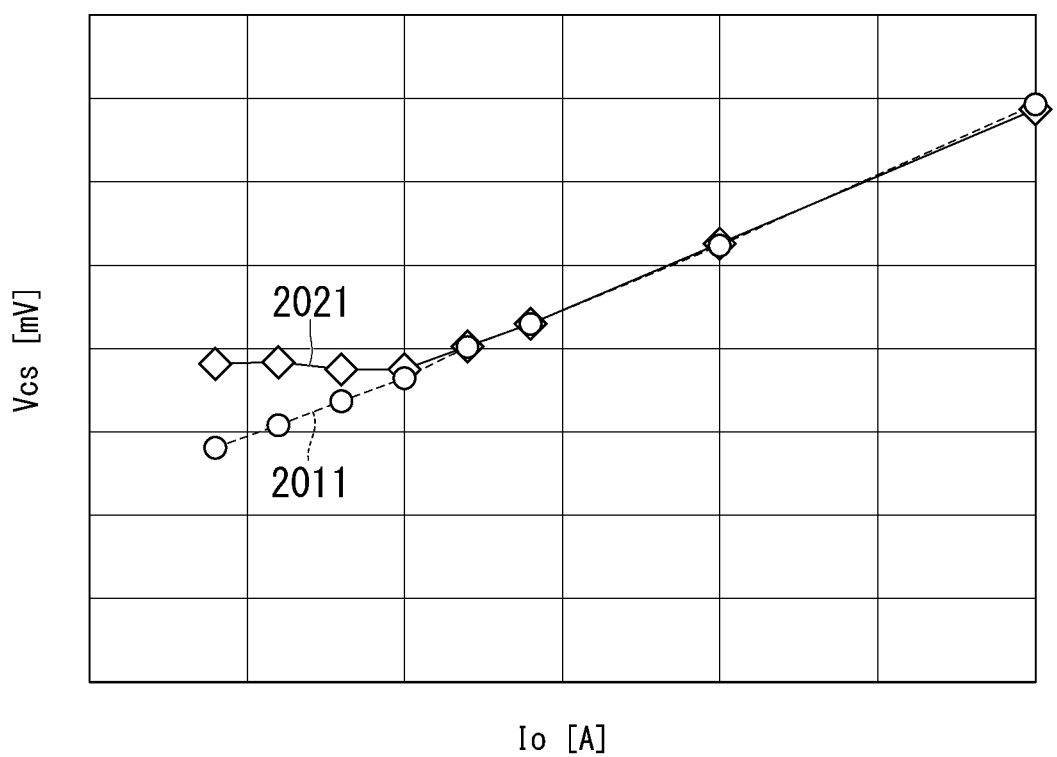
FIG. 7 is a diagram illustrating a relationship between a load current $I_o$ and a peak value of a detection voltage $V_{cs}$ showing an example of effects according to the first embodiment.

FIG. 7 is a diagram illustrating a relationship between the load current $I_o$ and the peak value of the detection voltage $V_{cs}$ showing an example of effects according to the first embodiment.

In a graph illustrated in FIG. 7, a horizontal axis indicates the load current $I_o$ [A], and the vertical axis indicates the detection voltage $V_{cs}$ [mV] (peak value in the example of FIG. 7).

In FIG. 7, a characteristic 2011 according to the present embodiment (proposal example) and a characteristic 2021 according to the comparative example are shown.

Here, the characteristic 2011 according to the present embodiment is a characteristic according to the example of FIG. 3, shows a tendency and is not numerically strict.

Figure 12:
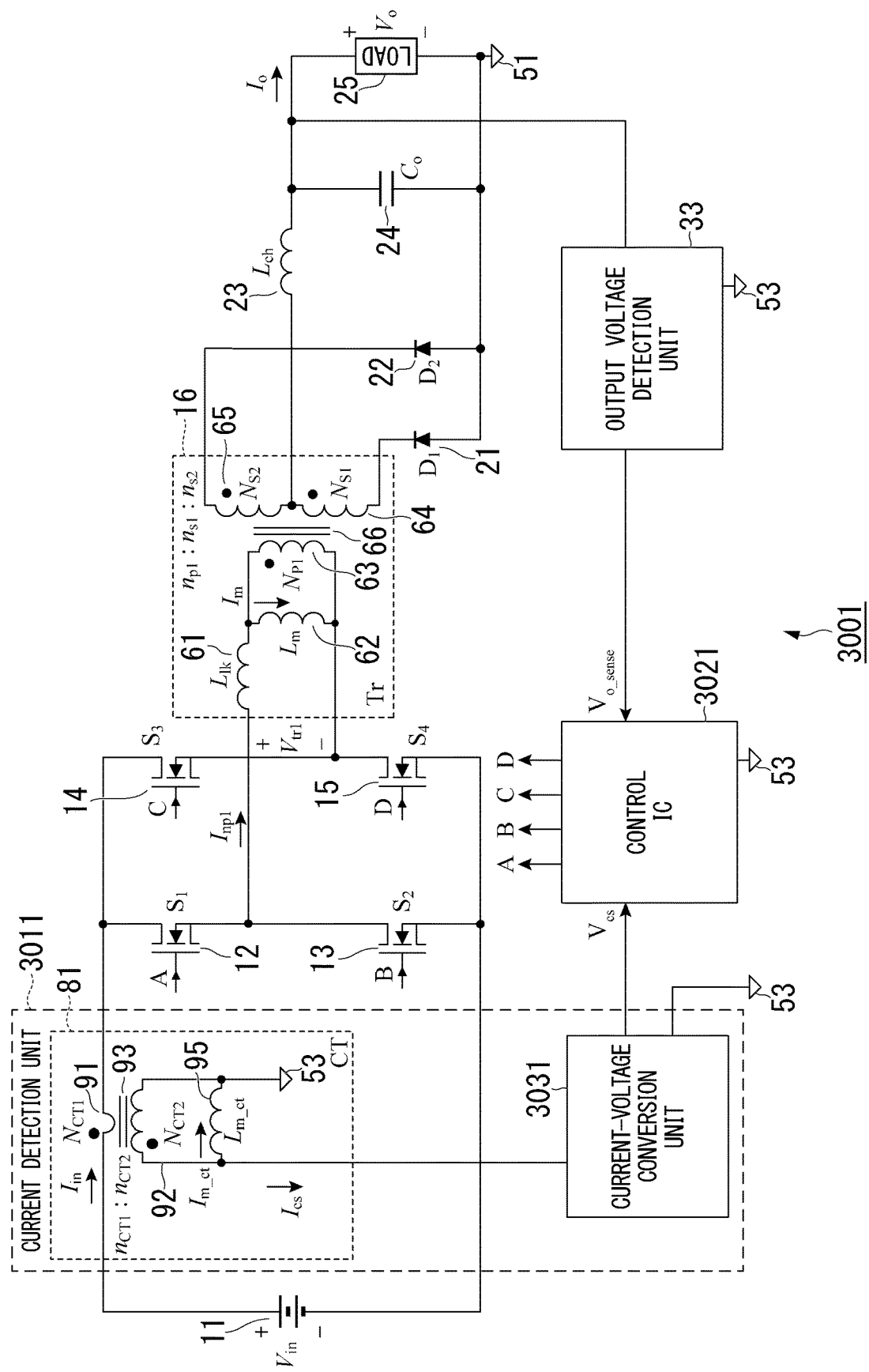
FIG. 12 is a diagram illustrating a configuration of a power conversion device according to a comparative example.
Figure 13:
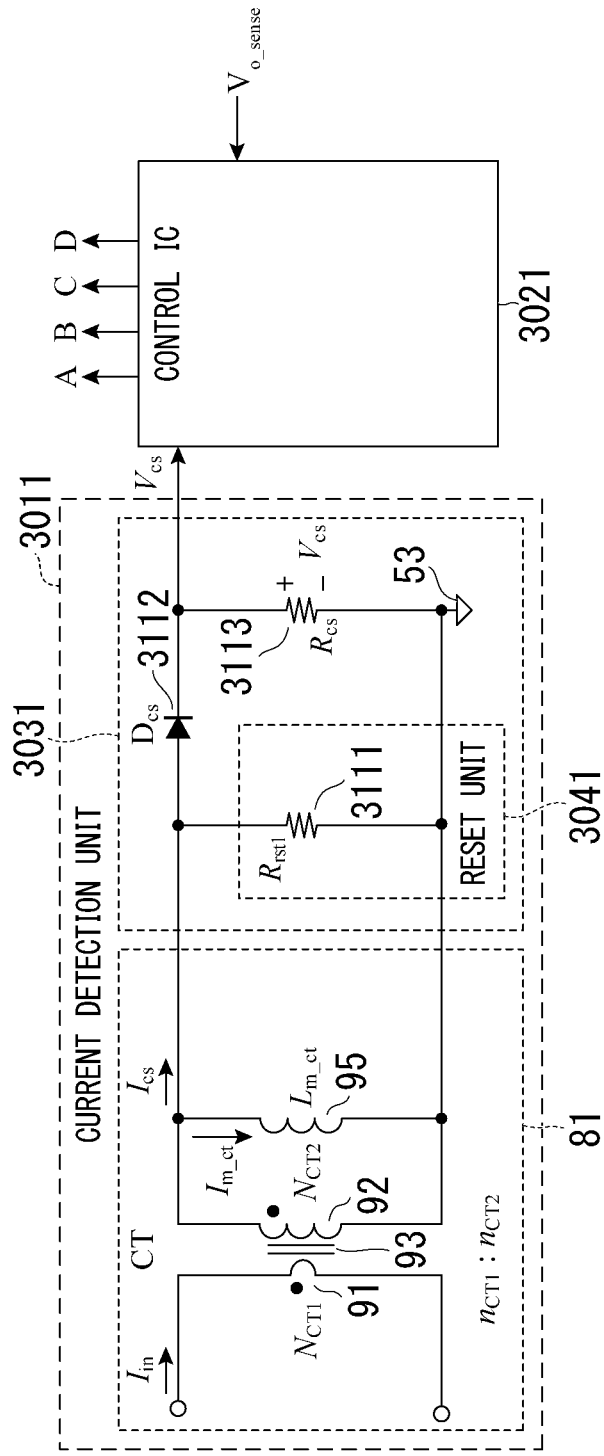
FIG. 13 is a diagram illustrating a configuration of a current detection unit according to the comparative example.
Figure 14:
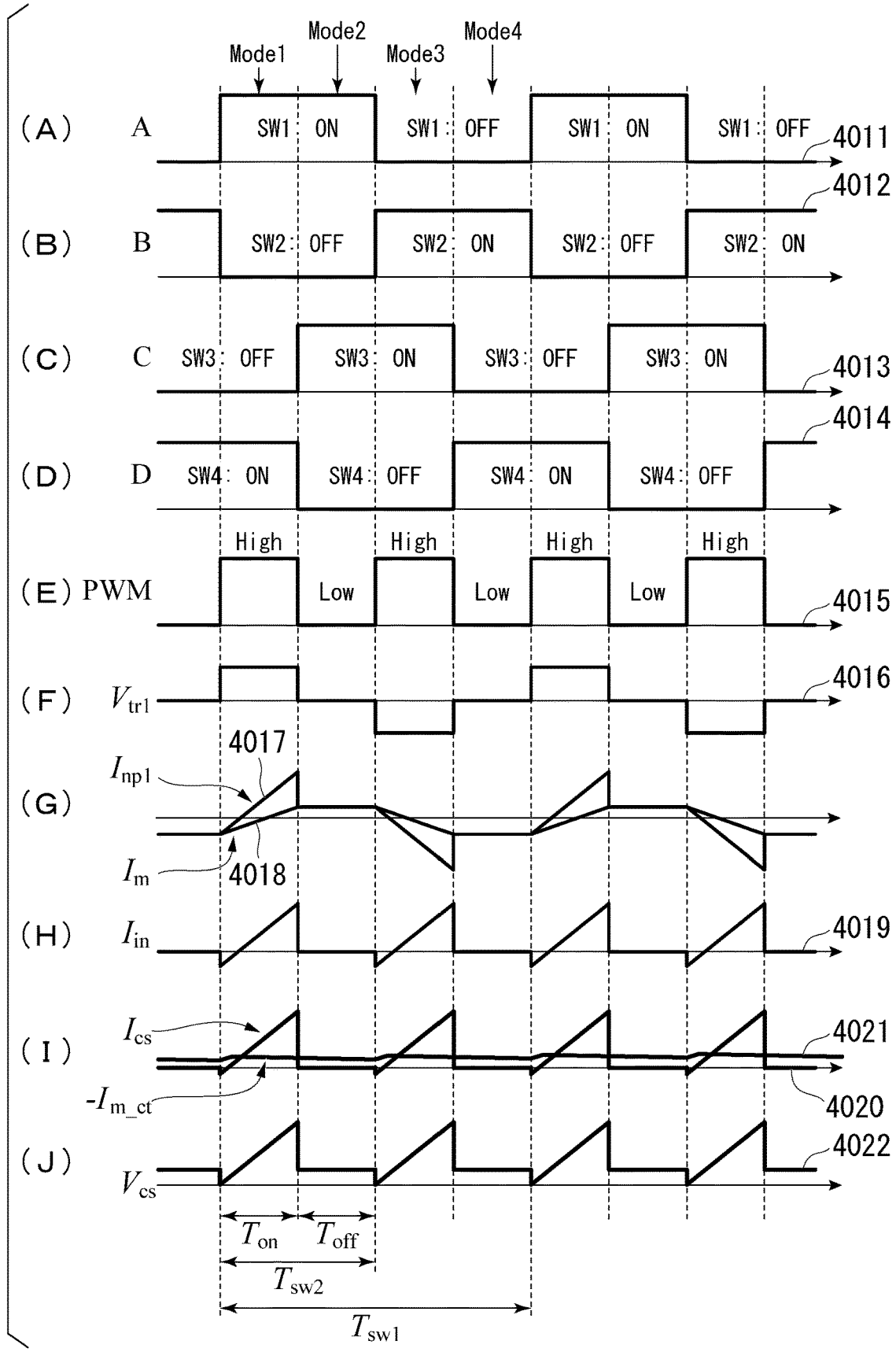
FIG. 14 is a diagram showing lines (A) to (J), which illustrate operation waveforms of respective units according to the comparative example.

On the other hand, the characteristic 2021 according to the comparative example is a characteristic according to comparative examples illustrated in FIGS. 12 to 14, shows a tendency and is not numerically strict.

As illustrated in FIG. 7, in the characteristic 2021 according to the comparative example, the linearity of the peak value of the detection voltage $V_{cs}$ with respect to the load current $I_o$ is crumbled at the time of a light load in which the primary side input current $I_{in}$ is a current flowing in both the positive and negative directions, whereas in the characteristic 2011 according to the present embodiment, the linearity of the peak value of the detection voltage $V_{cs}$ with respect to the load current $I_o$ can be maintained even at the time of the light load.

Here, a power conversion device according to the comparative example will be described with reference to FIGS. 12 to 14.

FIG. 12 is a diagram illustrating a configuration of the power conversion device 3001 according to the comparative example.

For convenience of description, differences between the power conversion device 3001 according to the comparative example and the power conversion device 1 illustrated in FIG. 1 will be described. In the example of FIG. 12, for convenience of description, the same components as those of the power conversion device 1 illustrated in FIG. 1 are denoted by the same reference signs.

In the power conversion device 3001 according to the comparative example, a circuit configuration of a current-voltage conversion unit 3031 of the current detection unit 3011 is a circuit configuration illustrated in FIG. 13 and switching of the resistance value of the reset resistor is not performed.

Further, in the power conversion device 3001 according to the comparative example, a control IC 3021 does not output the reset signal RST_SW to the current-voltage conversion unit 3031 of the current detection unit 3011.

FIG. 13 is a diagram illustrating a configuration of the current detection unit 3011 according to the comparative example.

The current detection unit 3011 includes a reset resistor 3111, a detection diode 3112, and a detection resistor 3113.

The current transformer 81, the detection diode 3112, and the detection resistor 3113 are connected in series in order, and then connected to the ground terminal 53. Further, the reset resistor 3111 is connected in parallel to the detection diode 3112 and the detection resistor 3113.

A reset unit 3041 includes the reset resistor 3111.

FIG. 14 is a diagram showing lines (A) to (J), which illustrate operation waveforms of the respective units according to a comparative example.

Line (A) of FIG. 14 illustrates an operation waveform 4011 showing an ON and OFF timing of the FET 12.

Line (B) of FIG. 14 illustrates an operation waveform 4012 showing an ON and OFF timing of the FET 13.

Line (C) of FIG. 14 illustrates an operation waveform 4013 showing an ON and OFF timing of the FET 14.

Line (D) of FIG. 14 illustrates an operation waveform 4014 showing an ON and OFF timing of the FET 15.

Line (E) of FIG. 14 illustrates an operation waveform 4015 of the PWM.

Line (F) of FIG. 14 illustrates an operation waveform 4016 of a primary transformer voltage $V_{tr1}$ applied to the transformer 16.

Line (G) of FIG. 14 illustrates an operation waveform 4017 of the primary transformer current $I_{np1}$ input to the transformer 16 and an operation waveform 4018 of the exciting current $I_m$ flowing through the excitation inductor 62.

Line (H) of FIG. 14 illustrates an operation waveform 4019 of the primary side input current $I_{in}$.

Line (I) of FIG. 14 illustrates an operation waveform 4020 of the current $I_{cs}$ under detection in the current detection unit 3011 and an operation waveform 4021 of a current ($-I_{m\_ct}$) obtained by reversing a positive or negative exciting current $I_{m\_ct}$ of the current transformer 81.

Line (J) of FIG. 14 illustrates an operation waveform 4022 of a detection voltage $V_{cs}$ in the current detection unit 3011.

Here, during periods of mode 1 and mode 3 in which the primary side input current $I_{in}$ flows, the current $I_{cs}$ under detection flows in the positive direction, the detection diode $D_{cs}$ conducts, and a current flows through the detection resistor $R_{cs}$. As a result, the current $I_{cs}$ under detection is converted into the detection voltage $V_{cs}$ and input to the control IC 3021.

On the other hand, during the period of mode 2 and mode 4 in which the primary side input current $I_{in}$ does not flow, the primary side input current $I_{in}$ does not flow. Since the exciting current $I_{m\_ct}$ of the current transformer 81 tends to continue to flow in the positive direction during this period, the current $I_{cs}$ under detection flows in the negative direction, the detection diode $D_{cs}$ does not conduct, and magnetic reset of the current transformer 81 is performed by the reset resistor 3111.

Generally, a reset time $T_r$ that can be used for reset of the current transformer 81 must be equal to or shorter than the time $T_{off}$. When a maximum value of Duty2 is larger, the time $T_{off}$ is shortened and thus, the reset time $T_r$ also needs to be set to be short.

Generally, in order to shorten the reset time $T_r$, the resistance value of the reset resistor 3111 becomes a relatively large design value on the order of hundreds of kΩ.

Here, the time of a light load of the load current $I_o$ is considered. In this case, when the load current $I_o$ becomes low, the primary side input current $I_{in}$ starts to become a current flowing in both the positive and negative directions, as illustrated in line (H) of FIG. 14.

When the primary side transformer current $I_{np1}$ flowing through the primary side winding 63 of the transformer 16 approaches the exciting current $I_m$ of the transformer 16 at the start timing of mode 1 and mode 3, the primary side input current $I_{in}$ has a component flowing in the negative direction. When the primary side input current $I_{in}$ has a component flowing in the negative direction, a current flowing through the secondary side winding 92 of the current transformer 81 has a component flowing in the negative direction (that is, the current $I_{cs}$ under detection has a component flowing in the negative direction), the detection diode 3112 do not conduct, and a current flows through the reset resistor 3111. Accordingly, a voltage is generated at both terminals of the reset resistor 3111, and a large amount of energy is stored in the excitation inductor 95 of the current transformer 81 (that is, the component in the negative direction of the exciting current $I_{m\_ct}$ of the current transformer 81 is increased).

Thereafter, energy release of the excitation inductor 95 occurs in the same state, but the energy release of the excitation inductor 95 continues in mode 2 and mode 4. In these modes, the current $I_{cs}$ under detection continues to flow in the positive direction due to the exciting current $I_m$, the detection diode $D_{cs}$ conducts, and a current flows through the detection resistor $R_{cs}$ such that the voltage waveform of the detection voltage $V_{cs}$ rises and the linearity of the detection voltage $V_{cs}$ with respect to the load current $I_o$ is lost.

Here, when the resistance value of the reset resistor 3111 is larger, the energy stored in the excitation inductor 95 of the current transformer 81 is increased, and there arises a problem that an actually generated detection voltage $V_{cs}$ is higher than an original detection voltage $V_{cs}$, and the linearity of current detection with respect to the load current $I_o$ is crumbled.

The current detection unit 31 in the power conversion device 1 according to the present embodiment can solve such a problem and maintain the linearity of the current detection with respect to the load current $I_o$.

As described above, in the power conversion device 1 according to the present embodiment, when a light load current becomes a current flowing in both the positive and negative directions, an impedance of the magnetic reset of the current transformer 81 in the current detection unit 31 is decreased. Accordingly, in the power conversion device 1, even when the light load current becomes the current flowing in both the positive and negative directions, there is no dependence on the exciting current $I_{m\_ct}$ of the current transformer 81 and the waveform of the detection voltage $V_{cs}$ detected by the detection resistor $R_{cs}$ becomes a voltage corresponding only to the positive side of a current waveform, and the linearity of the peak voltage of the detection voltage $V_{cs}$ with respect to the load current $I_o$ can be maintained. Therefore, in the power conversion device 1, it is possible to stabilize an operation of the peak current mode control.

As described above, in the power conversion device 1 according to the present embodiment, it is possible to compensate detection accuracy of a switching current through switching of a connection state of a resistor even when the switching current has a component in a direction opposite to a predetermined direction. In the present embodiment, a resistor having appropriate characteristics (for example, the second reset resistor 212 in the present embodiment) may be used.

In the power conversion device 1 according to the present embodiment, since a component in a negative direction is not generated in the waveform of the detection voltage $V_{cs}$, it is possible to prevent a negative voltage from being applied to an input unit of the control IC 41.

In the present embodiment, an aspect for decreasing a resistance value of the magnetic reset is used as an aspect for decreasing the impedance of the magnetic reset.

In the present embodiment, since a switch of the reset unit (the switch element 215 of the reset unit 111) in the current detection unit 31, in addition to the switches (FETs 12 to 15) that perform switching in the main circuit, is included and control is performed according to another control signal, there is no problem that, for example, when the switch of the main circuit and the switch of the reset unit are common, accuracy of control for driving both at the same time cannot be obtained.

In the present embodiment, since the reset unit (reset unit 111) includes the reset diode 214 and the reset capacitor 213 that converts a voltage across both terminals into a DC voltage, it is possible to decrease the voltage applied to both terminals of the switch (switch element 215), to use a switch with a low withstand voltage and to stabilize drive of the switch.

Here, although in the present embodiment, a case in which the DC power supply 11 and the load (LOAD) 25 are included in the power conversion device 1 has been shown, a separate configuration in which one or both of the DC power supply 11 and the load (LOAD) 25 may be separate bodies instead of being included in the power conversion device 1 may be used. In such a case, for example, a power system including the power conversion device 1 and the separate DC power supply 11, a power system including the power conversion device 1 and the separate load (LOAD) 25, or a power system including the DC power supply 11, the load (LOAD) 25, and the power conversion device 1 may be configured. Further, the power system may have any other configuration.

Second Embodiment

In the present embodiment, a configuration of the reset unit 111 in the current detection unit 31 of the power conversion device 1 differs from that in the example of FIG. 3 according to the first embodiment, and the configurations are the same in other respects.

Figure 8:
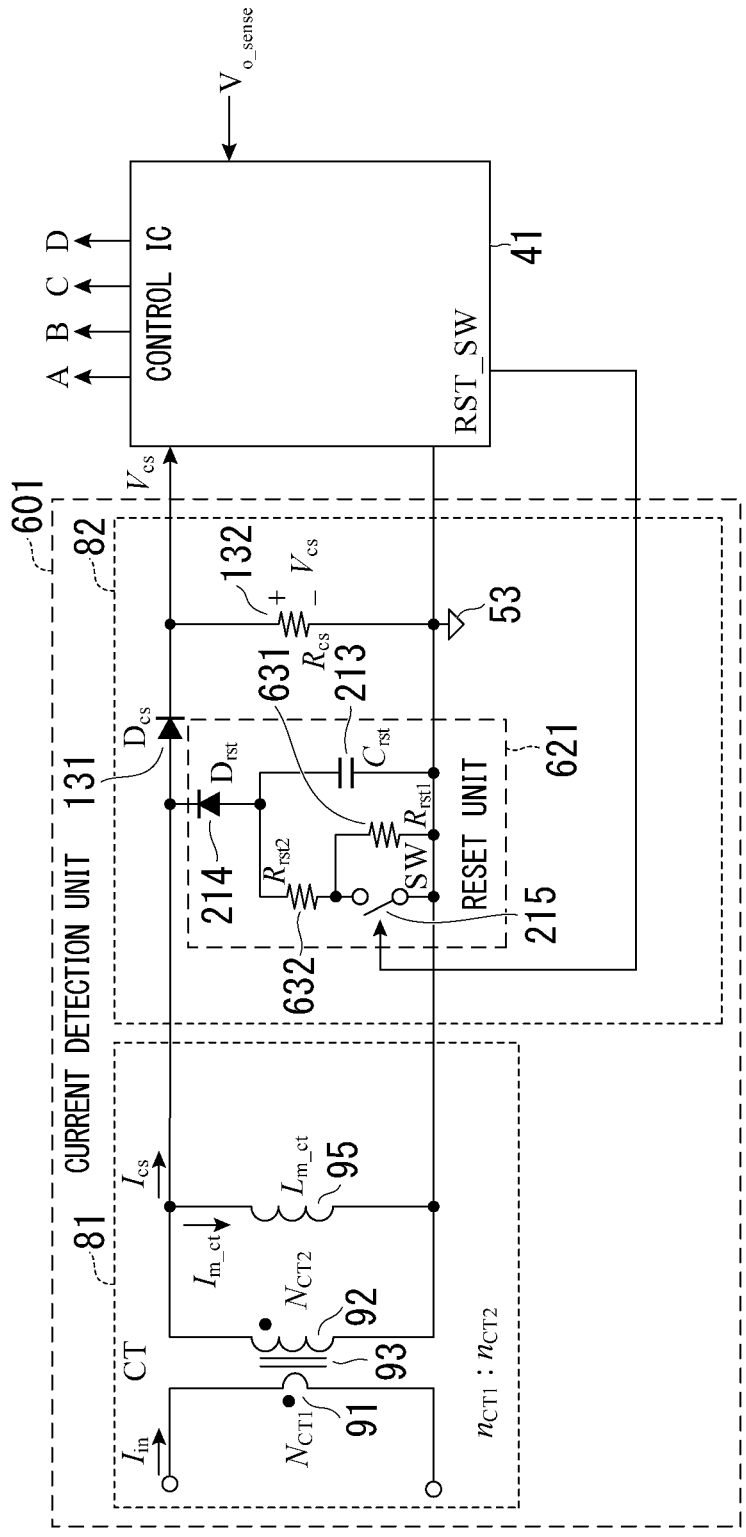
FIG. 8 is a diagram illustrating a configuration of a current detection unit according to a second embodiment.

FIG. 8 is a diagram illustrating a configuration of a current detection unit 601 according to the second embodiment.

Schematically, a configuration of the current detection unit 601 differs from that in the example of FIG. 3 in that a reset unit 621 having a different configuration is used instead of the reset unit 111 illustrated in FIG. 3.

In the present embodiment, for convenience of description, the same components as those in the example of FIG. 3 are denoted by the same reference signs.

The reset unit 621 includes a first reset resistor 631 (first reset resistor $R_{rst1}$), a second reset resistor 632 (second reset resistor $R_{rst2}$), a reset capacitor 213 (reset capacitor $C_{rst}$), a reset diode 214 (reset diode $D_{rst}$), and a switch element 215 (switch SW), as an impedance switching circuit 121.

The configuration of the reset unit 621 according to the present embodiment differs from the reset unit 111 illustrated in FIG. 3 in a disposition (connection method) of the first reset resistor 631 and the second reset resistor 632. In the reset unit 621, the first reset resistor 631 is connected between both terminals of the switch element 215. When the switch element 215 is a MOS-FET, the first reset resistor 631 is connected between the source and the drain of the switch element 215.

This will be described in detail.

The switch element 215 is connected in parallel to the first reset resistor 631, and the parallel connection circuit is connected in series with the second reset resistor 632. Further, a circuit including these is connected in parallel to the reset capacitor 213.

In the present embodiment, when the reset signal RST_SW is a Lo signal, the switch element 215 is turned off. As a result, the first reset resistor 631 and the second reset resistor 632 are connected in series, and the resistance value of the combined reset resistor is substantially equal to the resistance value of the first reset resistor 631.

On the other hand, when the reset signal RST_SW is a Hi signal, the switch element 215 is turned on. As a result, the switch element 215 and the second reset resistor 632 are connected in series, and the resistance value of the combined reset resistor is substantially equal to the resistance value of the second reset resistor 632.

As described above, in the power conversion device 1 according to the present embodiment, it is possible to compensate detection accuracy of the switching current through switching of a connection state of a resistor even when the switching current has a component in a direction opposite to a predetermined direction, as in the case of the first embodiment.

Third Embodiment

In the present embodiment, the configuration of the reset unit 111 in the current detection unit 31 of the power conversion device 1 differs from the example of FIG. 3 according to the first embodiment, and the configurations are the same in other respects.

Figure 9:
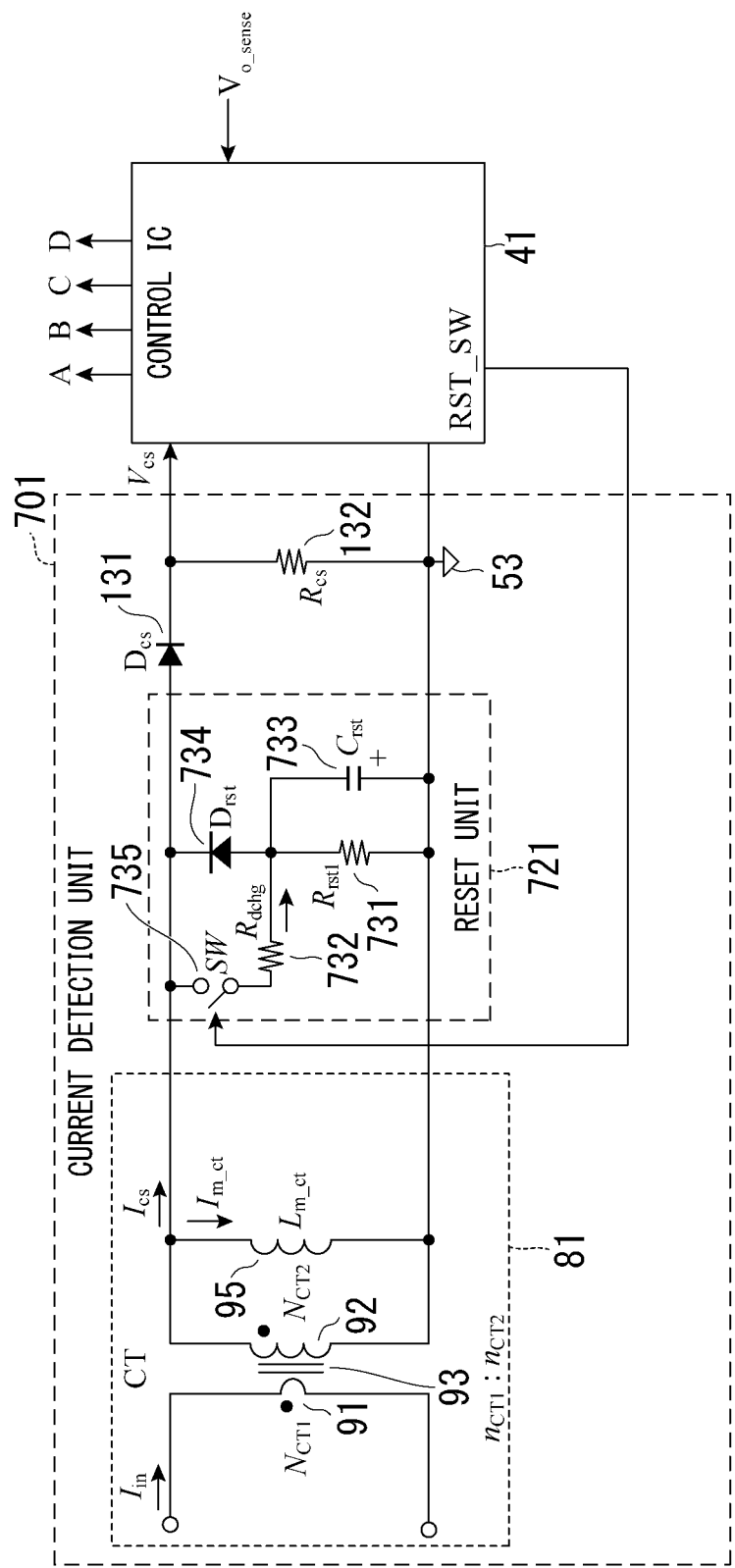
FIG. 9 is a diagram illustrating a configuration of a current detection unit according to a third embodiment.

FIG. 9 is a diagram illustrating a configuration of the current detection unit 701 according to the third embodiment. In FIG. 9, the control IC 41 is also illustrated.

A configuration of the current detection unit 701 differs from the example of FIG. 3 in that, schematically, a reset unit 721 having a different configuration is used instead of the reset unit 111 illustrated in FIG. 3 and is the same as in other respects.

In the present embodiment, for convenience of description, the same components as those in the example of FIG. 3 are denoted by the same reference signs.

The reset unit 721 includes a first reset resistor 731 (a first reset resistor $R_{rst1}$), a discharge resistor 732 (a discharge resistor $R_{dchg}$), a reset capacitor 733 (a reset capacitor $C_{rst}$), a reset diode 734 (a reset diode $D_{rst}$), and a switch element 735 (a switch SW), as the impedance switching circuit 121.

A series circuit of the switch element 735 and the discharge resistor 732, and the reset diode 734 are connected in parallel. Accordingly, one parallel connection circuit is configured.

Further, the first reset resistor 731 and the reset capacitor 733 are connected in parallel. Accordingly, the other parallel connection circuit is configured.

The one parallel connection circuit and the other parallel connection circuit are connected in series.

In the one parallel connection circuit, one terminal of the switch element 735 and the cathode of the reset diode 734 on the side opposite to the other parallel connection circuit are connected to the current transformer 81.

In the other parallel connection circuit, one terminal of the first reset resistor 731 and one terminal of the reset capacitor 733 on the side opposite to the one parallel connection circuit are connected to the ground terminal 53.

The reset diode 734 is connected in a direction in which the switching current blocks a current flowing in a predetermined direction. In the present embodiment, the switch element 735 is set in a non-conducting state when the switching current is the current flowing in the predetermined direction, and the switch element 735 is set in a conducting state when the switching current is a current also flowing in a direction opposite to the predetermined direction.

In the reset unit 721 according to the present embodiment, when the reset signal RST_SW output from the control IC 41 is switched from the Lo signal to the Hi signal, the switch element 735 is switched from the OFF state to the ON state. Accordingly, in the reset unit 721, the impedance is decreased when the switch element 735 is turned off.

Specifically, in the reset unit 721, charge is accumulated in the reset capacitor 733 when the switch element 735 is in the OFF state, and the charge accumulated in the reset capacitor 733 is discharged when the switch element 735 is in the ON state, so that the impedance is decreased. Therefore, in the present embodiment, the reset capacitor 733 is indispensable.

As described above, in the power conversion device 1 according to the present embodiment, it is possible to compensate detection accuracy of the switching current through switching of a connection state of a resistor even when the switching current has a component in a direction opposite to a predetermined direction, as in the case of the first embodiment.

In the present embodiment, an aspect for decreasing an impedance including a resistance value of the magnetic reset and a capacitance of the reset capacitor 733 is used as an aspect for decreasing the impedance of the magnetic reset.

Fourth Embodiment

In the present embodiment, configurations of the current detection unit 31 and the control IC 41 of the power conversion device 1 differ from those in the example of FIG. 3 according to the first embodiment and are the same in other respects.

Figure 10:
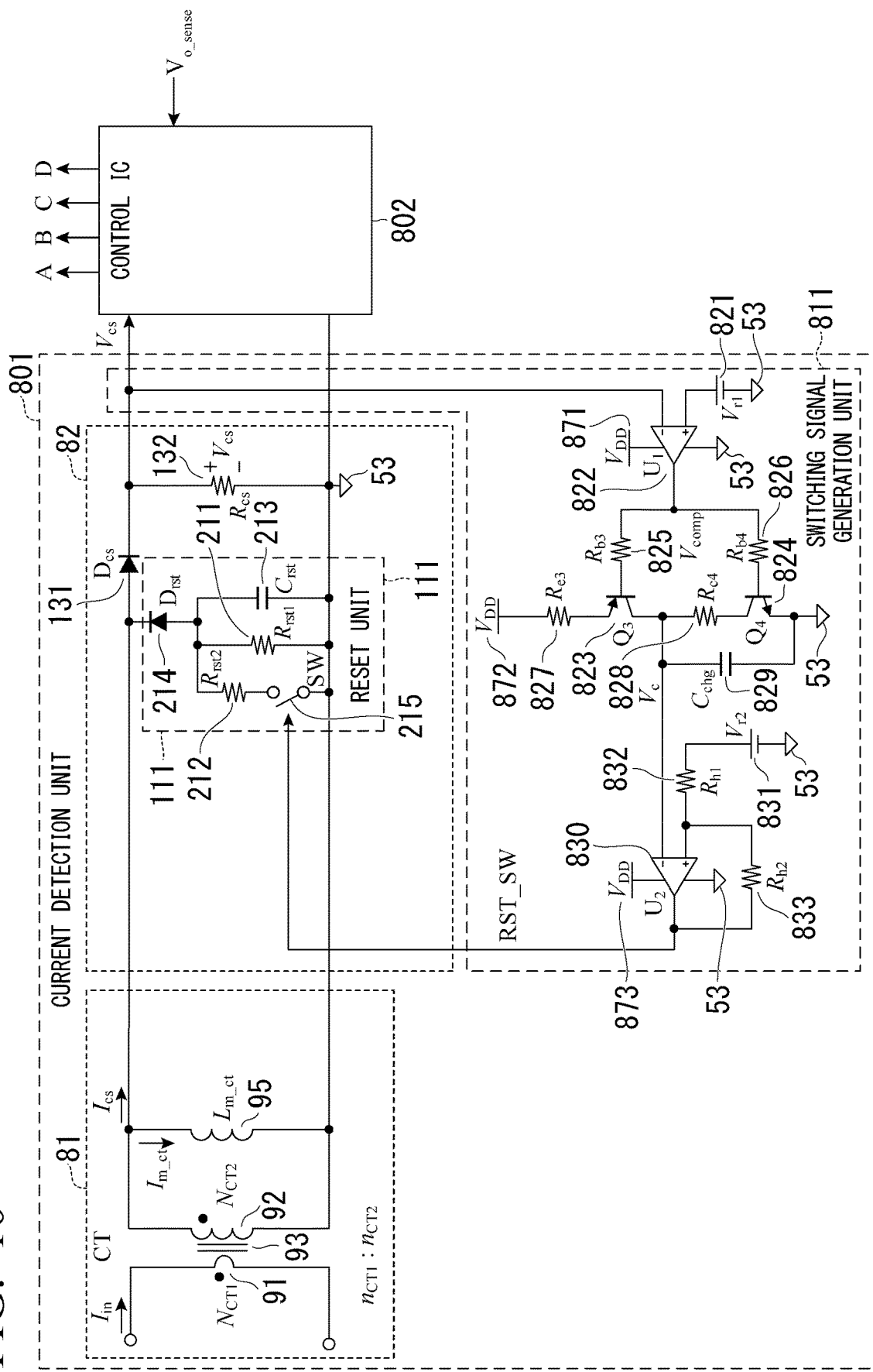
FIG. 10 is a diagram illustrating a configuration of a current detection unit according to a fourth embodiment.

FIG. 10 is a diagram illustrating a configuration of a current detection unit 801 according to the fourth embodiment. A control IC 802 is also illustrated in FIG. 10.

Schematically, a configuration of the current detection unit 801 differs from that in the example of FIG. 3 in that a switching signal generation unit 811 is included, the control IC 802 does not output the reset signal RST_SW, and the switching signal generation unit 811 generates the reset signal (switching signal), and the configurations are the same in other respects.

In the present embodiment, the same components as those in the example of FIG. 3 are denoted by the same reference signs for convenience of description.

A configuration of the control IC 802 differs from that of the control IC 41 illustrated in FIG. 3 in that generation and output of the reset signal RST_SW are not performed, and the configurations are the same in other respects.

In the current detection unit 801, the switching signal generation unit 811 is provided between the cathode of the detection diode 131 and a control terminal of the switch element 215 (a gate when the switch element 215 is a MOS-FET).

The switching signal generation unit 811 includes a first threshold value voltage source 821, a first comparator 822 (a first comparator $U_1$), a third switch element 823 (a third switch element Q3), a fourth switch element 824 (a fourth switch element Q4), a first base resistor 825 (a first base resistor $R_{b3}$), a second base resistor 826 (a second base resistor $R_{b4}$), an emitter resistor 827 (an emitter resistor $R_{e3}$), a collector resistor 828 (a collector resistor $R_{c4}$), a charge and discharge capacitor 829 (a charge and discharge capacitor $C_{chg}$), a second comparator 830 (a second comparator $U_2$), a second threshold value voltage source 831, a first hysteresis resistor 832 (a first hysteresis resistor $R_{h1}$), a second hysteresis resistor 833 (a second hysteresis resistor $R_{h2}$).

The third switch element 823 is a PNP transistor.
The fourth switch element 824 is an NPN transistor.
The control system power supplies 871 to 873 represent power supplies that supply a predetermined control system power supply voltage $V_{DD}$, and these may be common.

A negative input terminal of the first comparator 822 is connected to the voltage $V_{cs}$ terminal of the control IC 802.

A positive input terminal of the first comparator 822 is connected to one terminal of the first threshold value voltage source 821. The other terminal of the first threshold value voltage source 821 is connected to the ground terminal 53.

The first threshold value voltage source 821 outputs a predetermined first threshold value voltage $V_{r1}$ to the positive input terminal of the first comparator 822.

The control system power supply 871 and the ground terminal 53 (ground in the present embodiment) are connected to the first comparator 822 as positive and negative power supplies.

An output of the first comparator 822, one terminal of the first base resistor 825 and one terminal of the second base resistor 826 are connected.

The other terminal of the first base resistor 825 is connected to a base of the third switch element 823.

The other terminal of the second base resistor 826 is connected to a base of the fourth switch element 824.

An emitter of the third switch element 823 is connected to one terminal of the emitter resistor 827. A control system power supply 872 is connected to the other terminal of the emitter resistor 827.

The collector resistor 828 is connected between a collector of the third switch element 823 and a collector of the fourth switch element 824.

An emitter of the fourth switch element 824 is connected to the ground terminal 53.

A series connection of the fourth switch element 824 and the collector resistor 828, and the charge and discharge capacitor 829 are connected in parallel.

A negative input terminal of the second comparator 830 is connected to one terminal of the charge and discharge capacitor 829.

A positive input terminal of the second comparator 830 is connected to each of one terminal of the first hysteresis resistor 832 and one terminal of the second hysteresis resistor 833.

The control system power supply 873 and the ground terminal 53 (ground in the present embodiment) are connected to the second comparator 830 as positive and negative power supplies.

The other terminal of the first hysteresis resistor 832 is connected to one terminal of the second threshold value voltage source 831.

The other terminal of the second threshold value voltage source 831 is connected to the ground terminal 53.

The second threshold value voltage source 831 outputs a predetermined second threshold value voltage $V_{r2}$ to the first hysteresis resistor 832.

The second hysteresis resistor 833 is connected between the positive input terminal of the second comparator 830 and the output terminal of the second comparator 830.

The output terminal of the second comparator 830 is connected to the control terminal of the switch element 215 (a gate when the switch element 215 is a MOS-FET).

Here, the first threshold value voltage $V_{r1}$ is set near the value of the detection voltage $V_{cs}$ when the primary side input current $I_{in}$, starts to become a current flowing in both the positive and negative directions.

The first base resistor 825 is set so that a base current that can sufficiently turn on the third switch element 823 flows.

The second base resistor 826 is set so that a base current that can sufficiently turn on the fourth switch element 824 flows.

The emitter resistor 827 is a resistor for adjusting a charge time of the charge and discharge capacitor 829.

The charge and discharge capacitor 829 has a capacitance for adjusting a charge and discharge time.

The collector resistor 828 is a resistor for adjusting a discharge time of the charge and discharge capacitor 829.

Specifically, for example, the resistance value and the capacitance of the capacitor are set so that the voltage $V_c$ does not fall below the second threshold value voltage $V_{r2}$ during a period of the time $T_{off}$.

The second threshold value voltage $V_{r2}$, the first hysteresis resistor $R_{h1}$, and the second hysteresis resistor $R_{h2}$ are each set depending on a hysteresis width $V_{hys}$.

The hysteresis width $V_{hys}$ is set with a sufficient width so that the reset signal RST_SW does not repeat Hi and Low when a state of the load current $I_o$ is stable.

In the example of FIG. 10, a signal output from the second comparator 830 to the switch element 215 corresponds to the reset signal RST_SW (switching signal).

Figure 11:
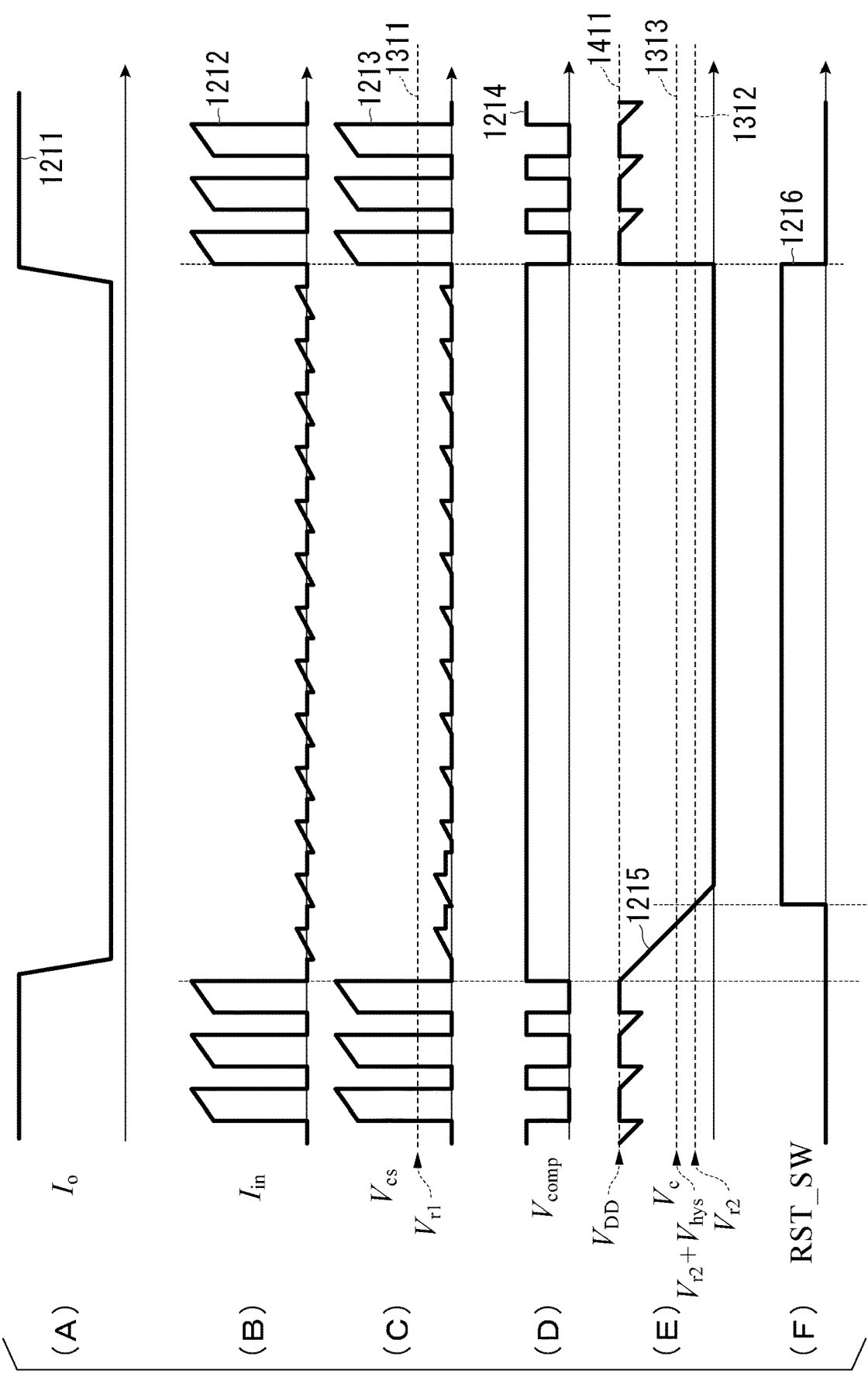
FIG. 11 is a diagram showing lines (A) to (F), which illustrate operation waveforms of respective units according to the fourth embodiment.

FIG. 11 is a diagram showing lines (A) to (F), which illustrate operation waveforms of the respective units according to the fourth embodiment.

Line (A) of FIG. 11 illustrates an operation waveform 1211 of the load current $I_o$.

Line (B) of FIG. 11 illustrates an operation waveform 1212 of the primary side input current $I_{in}$.

Line (C) of FIG. 11 illustrates an operation waveform 1213 of the detection voltage $V_{cs}$ in the current detection unit 801. In line (C) of FIG. 11, an operation waveform 1311 (a constant value in the present embodiment) of the first threshold value voltage $V_{r1}$ is illustrated.

Line (D) of FIG. 11 illustrates an operation waveform 1214 of the output voltage $V_{comp}$ of the first comparator 822.

Line (E) of FIG. 11 illustrates an operation waveform 1215 of the voltage $V_c$ at the negative input of the second comparator 830. In line (E) of FIG. 11, an operation waveform 1312 (a constant value in the present embodiment) of the second threshold value voltage $V_{r2}$, an operation waveform 1313 (a constant value in the present embodiment) of a sum of the second threshold value voltage $V_{r2}$ and the hysteresis width $V_{hys}$, and an operation waveform 1411 (a constant value in the present embodiment) of the control system power supply voltage $V_{DD}$ are shown.

Line (F) of FIG. 11 illustrates an operation waveform 1216 of the reset signal RST_SW generated in the switching signal generation unit 811.

When the load current $I_o$ is a current at the time of a heavy load, the primary side input current $I_{in}$ is a current flowing only in the positive direction. In this case, when the detection voltage $V_{cs}$ exceeds the first threshold value voltage $V_{r1}$, the output voltage $V_{comp}$ from the first comparator 822 becomes a Lo signal, whereas when the detection voltage $V_{cs}$ falls below the first threshold value voltage $V_{r1}$, the output voltage $V_{comp}$ from the first comparator 822 becomes a Hi signal.

When the output voltage $V_{comp}$ from the first comparator 822 is a Lo signal, the third switch element 823 is turned on, the charge and discharge capacitor 829 is charged by the control system power supply voltage $V_{DD}$, and the voltage $V_c$ of the charge and discharge capacitor 829 is increased.

When the output voltage $V_{comp}$ from the first comparator 822 is a Hi signal, the fourth switch element 824 is turned on, the charge and discharge capacitor 829 is discharged, and the voltage $V_c$ of the charge and discharge capacitor 829 is decreased.

When the primary side input current $I_{in}$ is the current flowing only in the positive direction, the voltage $V_c$ of the charge and discharge capacitor 829 is repeatedly increased and decreased. Accordingly, since the voltage $V_c$ of the charge and discharge capacitor 829 always exceeds the second threshold value voltage $V_{r2}$, the reset signal RST_SW becomes a Lo signal and switching of the resistance value of the reset resistor is not performed.

On the other hand, when the load current $I_o$ becomes a current at the time of a light load, the primary side input current $I_{in}$ becomes the current flowing in both the positive and negative directions. In this case, when the detection voltage $V_{cs}$ falls below the first threshold value voltage $V_{r1}$, the output voltage $V_{comp}$ from the first comparator 822 becomes a Hi signal.

When the output voltage $V_{comp}$ from the first comparator 822 is a Hi signal, the fourth switch element 824 is turned on, and the charge and discharge capacitor 829 repeatedly charged and discharged when the primary side input current $I_{in}$ is the current flowing only in the positive direction performs discharge so that the voltage $V_c$ of the charge and discharge capacitor 829 is decreased.

Accordingly, when the voltage $V_c$ of the charge and discharge capacitor 829 falls below the second threshold value voltage $V_{r2}$, the reset signal RST_SW becomes a Hi signal and switching of the resistance value of the reset resistor is performed. That is, an impedance of the reset resistor of the reset unit 111 is decreased.

For example, when a processing speed of the control IC 802 is low, when it is difficult to add a terminal for the reset signal RSW_SW to the control IC 802, or the like, the switching signal generation unit 811 according to the present embodiment is included such that switching of the resistance value of the reset resistor having a high response speed can be performed.

As described above, in the power conversion device 1 according to the present embodiment, even when the switching current has a component in the direction opposite to the predetermined direction, it is possible to compensate detection accuracy of the switching current through switching the connection state of the resistor.

Modification Examples Regarding Above Embodiment

Although the control IC 41 that outputs the reset signal RST_SW with the detection voltage $V_{cs}$ as a trigger or the switching signal generation unit 811 is used in the above embodiment, a configuration in which the reset signal RST_SW is output with another index as a trigger may be used as another configuration example. As the other index, for example, an input voltage sense value, Duty2 of a pulse of PWM, or the like may be used.

As an example, a configuration in which the reset signal RST_SW is output using the input voltage sense value as a trigger will be described.

When the input voltage $V_{in}$ increases, the time $T_{on}$ becomes shorter and the time $T_{off}$ becomes longer in order to keep the output voltage constant. Therefore, since the time $T_r$ that can be used for the magnetic reset of the current transformer 81 becomes long, the resistance value of the reset resistor can be switched to a low resistance (a connection in which the second reset resistor $R_{rst2}$ is mainly used).

Here, the input voltage sense value and the input voltage $V_{in}$ are in a proportional relationship.

Therefore, a configuration that, when the input voltage sense value exceeds a predetermined detection threshold Vin_th1, the resistance value of the reset resistor is switched to a low resistance, and when the input voltage sense value falls below a predetermined return threshold Vin_th2, the resistance value of the reset resistor is switched to an original value (a connection in which the first reset resistor $R_{rst1}$ is mainly used) can be used.

A certain degree of hysteresis width is provided in the detection threshold value Vin_th1 and the return threshold value Vin_th2.

However, since a magnetic reset time $T_r$ after switching depends on a resistance value of the second reset resistor $R_{rst2}$ to be selected, each threshold value is set so that (time $T_r \le$ time $T_{off}$) in consideration of the resistance value of the second reset resistor $R_{rst2}$.

The hysteresis may not be used, and the detection threshold value Vin_th1 and the return threshold value Vin_th2 may be set to the same value.

As another example, a configuration in which the reset signal RST_SW is output using Duty2 as a trigger will be described.

When the input voltage $V_{1n}$ increases or the load current $I_o$ decreases (that is, the load becomes light), Duty2 is decreased, the time $T_{on}$ becomes shorter, and the time $T_{off}$ becomes longer in order to keep the output voltage constant. Therefore, since the time $T_r$ that can be used for the magnetic reset of the current transformer 81 becomes long, the resistance value of the reset resistor can be switched to a low resistance (a connection in which the second reset resistor $R_{rst2}$ is mainly used).

Therefore, a configuration in which, when Duty2 falls below a predetermined detection threshold Duty2_th1, the resistance value of the reset resistor is switched to a low resistance, and when Duty2 exceeds a predetermined return threshold Duty2_th2, the resistance value of the reset resistor is switched to an original value (a connection in which the first reset resistor $R_{rst1}$ is mainly used) can be used.

A certain degree of hysteresis width is provided between the detection threshold value Duty2_th1 and the return threshold value Duty2_th2.

However, since a magnetic reset time $T_r$ after switching depends on a resistance value of the second reset resistor $R_{rst2}$ to be selected, each threshold value is set so that (time $T_r \le$ time $T_{off}$) in consideration of the resistance value of the second reset resistor $R_{rst2}$.

The hysteresis may not be used, and the detection threshold value Duty2_th1 and the return threshold value Duty2_th2 may be set to the same value.

In the above embodiment, the configuration in which the N-channel MOS-FET is used as the switch element and switching is performed is not limited thereto, and other switch elements may be used.

Further, in the above embodiment, the configuration in which the PNP transistor and the NPN transistor are used and driving is performed as a method of driving the N-channel MOS-FET is not limited thereto, and other driving methods may be used.

Although a configuration in which, in the reset unit 111 of the current detection unit 31, the reset unit 621 of the current detection unit 601, and the reset unit 721 of the current detection unit 701, the reset diodes 214 and 734 are provided on the side opposite to the ground side has been shown in the above embodiment, a configuration in which the reset diodes 214 and 734 are provided on the ground side may be used as another configuration example.

Further, a connection order of the switch element 215 and the second reset resistor 212 may be reversed. A connection order of the switch element 735 and the discharge resistor 732 may be reversed.

Further, a reversed aspect may be used for ON and OFF of the switch, and a reversed aspect may be used for Hi and Low of a signal.

Further, a thermistor may be used instead of a mechanical switch or a switch such as a FET. A resistance value of the thermistor changes with temperature. Therefore, for example, a configuration can be adopted so that a temperature of the main circuit is decreased and the resistance value of the thermistor is decreased at the time of a light load.

Further, for example, a non-insulated converter may be used instead of a configuration in which an insulated converter is used.

The current detection circuit according to the present embodiment may be applied to, for example, a main circuit including a transformer or a main circuit including a synchronous rectification circuit. In the synchronous rectification circuit, an input current flowing in both the positive and negative directions may be generated due to a shift of ON and OFF timings of the switch, as in the case of the present embodiment. The current detection circuit according to the present embodiment may be applied to a main circuit including both the transformer and the synchronous rectification circuit.

<Configuration Example>

A configuration example provides a current detection circuit (a circuit of the current detection unit 31, 601, 701, or 801 in the present embodiment) for detecting a value of a component in a predetermined direction (positive direction in the present embodiment) of a switching current using a current transformer (the current transformer 81 in the present embodiment), wherein, when the switching current flowing in the primary side of the current transformer has a component in the direction opposite to the predetermined direction, a connection state of the reset elements on the secondary side of the current transformer is switched so that the impedance of the magnetic reset on the secondary side of the current transformer is decreased.

The reset element may include various circuit elements.

As one configuration example (the example of FIG. 3), the current detection circuit includes a detection diode (the detection diode 131 in the present embodiment), a detection resistor (the detection resistor 132 in the present embodiment), and a first reset resistor (the first reset resistor 211 in the present embodiment) and a second reset resistor (the second reset resistor 212 in the present embodiment) as the reset elements, a reset diode (the reset diode 214 in the present embodiment), and a switch (the switch element 215 in the present embodiment), wherein a series connection circuit of the detection diode and the detection resistor is connected in parallel to the secondary side winding of the current transformer, a series connection circuit of the switch and the second reset resistor, and the first reset resistor are connected in parallel, the parallel connection circuit and the reset diode are connected in series, the circuits are connected in parallel to the secondary side winding of the current transformer, the detection diode is connected in a direction in which the detection diode conducts when the switching current flows in the predetermined direction, the reset diode is connected in a direction in which the reset diode blocks conduction when the switching current flows in the predetermined direction, the switch is set in a non-conducting state when the switching current is a current flowing in the predetermined direction, and the switch is set in a conducting state when the switching current is a current also flowing in a direction opposite to the predetermined direction.

As one configuration example (the example of FIG. 3), in the current detection circuit, a reset capacitor (the reset capacitor 213 in the present embodiment) is connected in parallel to the first reset resistor.

As one configuration example (the example of FIG. 8), the current detection circuit includes a detection diode (the detection diode 131 in the present embodiment), a detection resistor (the detection resistor 132 in the present embodiment), a first reset resistor (the first reset resistor 631 in the present embodiment) and a second reset resistor (the second reset resistor 632 in the present embodiment) as reset elements, a reset diode (the reset diode 214 in the present embodiment), and a switch (the switch element 215 in the present embodiment), wherein a series connection circuit of the detection diode and the detection resistor is connected in parallel to the secondary side winding of the current transformer, a parallel connection circuit of the switch and the first reset resistor, the second reset resistor, and the reset diode are connected in series, these circuits are connected in parallel to the secondary side winding of the current transformer, the detection diode is connected in a direction in which the detection diode conducts when the switching current flows in a predetermined direction, the reset diode is connected in a direction in which the reset diode blocks conduction when the switching current flows in the predetermined direction, the switch is set in a non-conducting state when the switching current is a current flowing in the predetermined direction, and the switch is set in a conducting state when the switching current is a current also flowing in a direction opposite to the predetermined direction.

As one configuration example (the example of FIG. 8), in the current detection circuit, a reset capacitor (the reset capacitor 213 in the present embodiment) is connected in parallel to both ends of a series connection of the parallel connection circuit of the switch and the first reset resistor and the second reset resistor.

As one configuration example (the example of FIG. 9), the current detection circuit includes a detection diode (the detection diode 131 in the present embodiment), a detection resistor (the detection resistor 132 in the present embodiment), a first reset resistor (the first reset resistor 731 in the present embodiment) and a discharge resistor (the discharge resistor 732 in the present embodiment) as reset elements, a reset capacitor (the reset capacitor 733 in the present embodiment), a reset diode (the reset diode 734 in the present embodiment), and a switch (the switch element 735 in the present embodiment), wherein a series connection circuit of the detection diode and the detection resistor is connected in parallel to the secondary side winding of the current transformer, a first parallel connection circuit of a series connection circuit of the switch and the discharge resistor, and the reset diode, and a second parallel connection circuit of the first reset resistor and the reset capacitor are connected in series, this series connection circuit is connected in parallel to the secondary side winding of the current transformer, the detection diode is connected in a direction in which the detection diode conducts when the switching current flows in the predetermined direction, the reset diode is connected in a direction in which the reset diode blocks conduction when the switching current flows in the predetermined direction, the switch is set in a non-conducting state when the switching current is a current flowing in the predetermined direction, and the switch is set in a conducting state when the switching current is a current also flowing in a direction opposite to the predetermined direction.

As one configuration example, in the current detection circuit, the switch is controlled on the basis of a predetermined index value.

As one configuration example, in the current detection circuit, the switch is controlled using hysteresis on the basis of the index value.

As one configuration example, in the current detection circuit, the index value is a detection value (the detection voltage $V_{cs}$ in the present embodiment) of the current detection circuit, an input voltage sense value (the voltage $V_{in\_sense}$) proportional to the input voltage, or a duty (Duty2 in the present embodiment) regarding a period in which a voltage applied to a transformer (the transformer 16 in the present embodiment) through which the switching current flows is turned on.

As one configuration example (examples of FIGS. 3, 8 and 9), in the current detection circuit, the switch is controlled using a signal output from the control unit (the control IC 41 in the present embodiment) that outputs a signal (the reset signal RST_SW in the present embodiment) for switching the switch on the basis of a predetermined detection value serving as the index value.

As one configuration example (the example of FIG. 10), the current detection circuit includes a circuit (the switching signal generation unit 811 in the present embodiment) that generates a signal for switching the switch on the basis of the detection value of the current detection circuit. The switch is controlled by the signal.

As one configuration example, the current detection circuit includes a switch that switches the impedance. The switch is controlled by a signal (the reset signal RST_SW in the present embodiment) different from that for the main switch (FETs 12 to 15 in the example of FIG. 1) through which a switching current flows.

As one configuration example, the current detection circuit includes a switch that switches the impedance, and the reset element includes a plurality of reset resistors and one or more reset capacitors.

As one configuration example (the example of FIG. 1), the power conversion device (the power conversion device 1 in the present embodiment) includes a main circuit that supplies an output voltage using a switching current, and a current detection circuit. As one configuration example (the example of FIG. 1), the power system includes a power conversion device.

Functions of arbitrary components in any device (for example, the control ICs 41 and 802) such as the power conversion device 1 described above may be realized by a processor. For example, each of the processes in the present embodiment may be realized by a processor that operates on the basis of information of a program or the like, and a computer-readable recording medium that stores the information of the program or the like. Here, in the processor, for example, functions of respective units may be realized by individual hardware, or the functions of the respective units may be realized by integrated hardware. For example, the processor may include hardware, and the hardware may include at least one of a circuit that processes a digital signal and a circuit that processes an analog signal. For example, the processor may be configured using one or a plurality of circuit devices mounted on a circuit board, or one or both of one or a plurality of circuit elements. An integrated circuit (IC) or the like may be used as the circuit device, and a resistor or a capacitor may be used as the circuit element.

Here, the processor may be, for example, a CPU. However, the processor is not limited to the CPU, and various processors such as a graphics processing unit (GPU) or a digital signal processor (DSP) may be used. Further, the processor may be, for example, a hardware circuit using an application specific integrated circuit (ASIC). The processor may be configured of, for example, a plurality of CPUs, or may be configured of a hardware circuit using a plurality of ASICs. Further, the processor may be configured of, for example, a combination of a plurality of CPUs with a hardware circuit using a plurality of ASICs. Further, the processor may include, for example, one or more of amplifier circuits or filter circuits that process analog signals.

The present embodiment of the present disclosure has been described above in detail with reference to the drawings, but a specific configuration is not limited to the present embodiment, and a design and the like in a range not departing from the gist of the present disclosure are also included.

Aspects of the present disclosure are shown below (1) to (15).

(1) An aspect of the present disclosure is a current detection circuit for detecting a value of a component in a predetermined direction of a switching current using a current transformer, wherein, when the switching current flowing in a primary side of the current transformer has a component in a direction opposite to the predetermined direction, a connection state of reset elements on a secondary side of the current transformer is switched such that an impedance of a magnetic reset on the secondary side of the current transformer is decreased.

(2) An aspect of the present disclosure is the current detection circuit according to (1), comprising: a detection diode; a detection resistor; a first reset resistor and a second reset resistor as the reset elements; a reset diode; and a switch, wherein a series connection circuit of the detection diode and the detection resistor is connected in parallel to the secondary side winding of the current transformer, a series connection circuit of the switch and the second reset resistor, and the first reset resistor are connected in parallel, the parallel connection circuit and the reset diode are connected in series, and the circuits are connected in parallel to the secondary side winding of the current transformer, the detection diode is connected in a direction in which the detection diode conducts when the switching current flows in the predetermined direction, the reset diode is connected in a direction in which the reset diode blocks conduction when the switching current flows in the predetermined direction, the switch is set in a non-conducting state when the switching current is a current flowing in the predetermined direction, and the switch is set in a conducting state when the switching current is also a current flowing in a direction opposite to the predetermined direction.

(3) An aspect of the present disclosure is the current detection circuit according to (2), wherein a reset capacitor is connected in parallel to the first reset resistor.

(4) An aspect of the present disclosure is the current detection circuit according to (1), comprising: a detection diode; a detection resistor; a first reset resistor and a second reset resistor as the reset elements; a reset diode; and a switch, wherein a series connection circuit of the detection diode and the detection resistor is connected in parallel to the secondary side winding of the current transformer, a parallel connection circuit of the switch and the first reset resistor, the second reset resistor, and the reset diode are connected in series, and the circuits are connected in parallel to the secondary side winding of the current transformer, the detection diode is connected in a direction in which the detection diode conducts when the switching current flows in the predetermined direction, the reset diode is connected in a direction in which the reset diode blocks conduction when the switching current flows in the predetermined direction, the switch is set in a non-conducting state when the switching current is a current flowing in the predetermined direction, and the switch is set in a conducting state when the switching current is also a current flowing in a direction opposite to the predetermined direction.

(5) An aspect of the present disclosure is the current detection circuit according to (4), wherein a reset capacitor is connected in parallel to both ends of a series connection of the parallel connection circuit of the switch and the first reset resistor, and the second reset resistor.

(6) An aspect of the present disclosure is the current detection circuit according to (1), comprising: a detection diode; a detection resistor; a first reset resistor and a discharge resistor as the reset elements; a reset capacitor; a reset diode; and a switch, wherein a series connection circuit of the detection diode and the detection resistor is connected in parallel to the secondary side winding of the current transformer, a first parallel connection circuit of a series connection circuit of the switch and the discharge resistor, and the reset diode, and a second parallel connection circuit of the first reset resistor and the reset capacitor are connected in series, and the series connection circuit is connected in parallel to the secondary side winding of the current transformer, the detection diode is connected in a direction in which the detection diode conducts when the switching current flows in the predetermined direction, the reset diode is connected in a direction in which the reset diode blocks conduction when the switching current flows in the predetermined direction, the switch is set in a non-conducting state when the switching current is a current flowing in the predetermined direction, and the switch is set in a conducting state when the switching current is also a current flowing in a direction opposite to the predetermined direction.

(7) An aspect of the present disclosure is the current detection circuit according to any one of (2) to (6), wherein the switch is controlled on the basis of a predetermined index value.

(8) An aspect of the present disclosure is the current detection circuit according to (7), wherein the switch is controlled using hysteresis on the basis of the index value.

(9) An aspect of the present disclosure is the current detection circuit according to (7) or (8), wherein the index value is a detection value of the current detection circuit, an input voltage sense value proportional to an input voltage, or a duty regarding a period in which a voltage applied to a transformer through which the switching current flows is turned on.

(10) An aspect of the present disclosure is the current detection circuit according to any one of (7) to (9), wherein the switch is controlled by the signal output from a control unit configured to output a signal for switching the switch on the basis of the predetermined detection value serving as the index value.

(11) An aspect of the present disclosure is the current detection circuit according to any one of (2) to (10), comprising: a circuit configured to generate a signal for switching the switch on the basis of a detection value of the current detection circuit, wherein the switch is controlled by the signal.

(12) An aspect of the present disclosure is the current detection circuit according to (1), comprising a switch configured to switch the impedance, wherein the switch is controlled using a signal different from that for a main switch through which the switching current flows.

(13) An aspect of the present disclosure is the current detection circuit according to (1), comprising: a switch configured to switch the impedance, wherein the reset element includes a plurality of reset resistors and one or more reset capacitors.

(14) An aspect of the present disclosure is a power conversion device comprising: a main circuit configured to supply an output voltage using the switching current; and the current detection circuit according to any one of (1) to (10).

(15) An aspect of the present disclosure is a power system comprising the power conversion device according to (14).

EXPLANATION OF REFERENCES 1, 3001 Power conversion device
11 DC power supply
12-15 FET
16 Transformer
21-22 Rectification diode
23 Choke coil
24 Output capacitor
25 Load
31, 601, 701, 801, 3011 Current detection unit
33 Output voltage detection unit
41, 802, 3021 Control IC
51, 53 Ground terminal
61 Leakage inductor
62, 95 Excitation inductor
63, 91 Primary side winding
64-65, 92 Secondary side winding
66, 93 Core
81 Current transformer
82, 3031 Current-voltage conversion unit
111, 621, 721, 3041 Reset unit
121 Impedance switching circuit
131, 3112 Detection resistor
132, 3113 Detection resistor
211, 631, 731 First reset resistor
212, 632 Second reset resistor
213, 733 Reset capacitor
214, 734 Reset diode
215, 735 Switch element
511 Reference power supply
512 Error amplifier
513 Slope voltage source
514 Adder
515 Comparator
516 Reference pulse generator
517 Pulse generation unit
531 Peak value detection unit
532 CT reset signal generator
732 Discharge resistor
1011-1201, 1211-1216, 1311-1313, 1411, 4011-4022 Operation waveform
821 First threshold value voltage source
822 First comparator
823 Third switch element
824 Fourth switch element
825 First base resistor
826 Second base resistor
827 Emitter resistor
828 Collector resistor
829 Charge and discharge capacitor
830 Second comparator
831 Second threshold current source
832 First hysteresis resistor
833 Second hysteresis resistor
871-873 Control system power supply
2011, 2021 Characteristics
3111 Reset resistor

What is claimed is:

1. A current detection circuit for detecting a value of a component in a predetermined direction of a switching current using a current transformer,
wherein, when the switching current flowing in a primary side of the current transformer has a component in a direction opposite to the predetermined direction, a connection state of reset elements on a secondary side of the current transformer is switched such that an impedance of a magnetic reset on the secondary side of the current transformer is decreased,
wherein the reset elements include at least a first resistor and a second resistor.

2. The current detection circuit according to claim 1, comprising: a detection diode; a detection resistor; a first reset resistor and a second reset resistor as the reset elements; a reset diode; and a switch,
wherein a series connection circuit of the detection diode and the detection resistor is connected in parallel to the secondary side winding of the current transformer,
a series connection circuit of the switch and the second reset resistor, and the first reset resistor are connected in parallel, the parallel connection circuit and the reset diode are connected in series, and the circuits are connected in parallel to the secondary side winding of the current transformer,
the detection diode is connected in a direction in which the detection diode conducts when the switching current flows in the predetermined direction,
the reset diode is connected in a direction in which the reset diode blocks conduction when the switching current flows in the predetermined direction,
the switch is set in a non-conducting state when the switching current is a current flowing in the predetermined direction, and
the switch is set in a conducting state when the switching current is also a current flowing in a direction opposite to the predetermined direction,
wherein the first reset resistor is the first resistor and the second reset resistor is the second resistor.

3. The current detection circuit according to claim 2, wherein a reset capacitor is connected in parallel to the first reset resistor.

4. The current detection circuit according to claim 2, wherein the switch is controlled on the basis of a predetermined index value.

5. The current detection circuit according to claim 4, wherein the switch is controlled using hysteresis on the basis of the index value.

6. The current detection circuit according to claim 4, wherein the index value is a detection value of the current detection circuit, an input voltage sense value proportional to an input voltage, or a duty regarding a period in which a voltage applied to a transformer through which the switching current flows is turned on.

7. The current detection circuit according to claim 4, wherein the switch is controlled by the signal output from a control unit configured to output a signal for switching the switch on the basis of the predetermined detection value serving as the index value.

8. The current detection circuit according to claim 2, comprising:
a circuit configured to generate a signal for switching the switch on the basis of a detection value of the current detection circuit,
wherein the switch is controlled by the signal.

9. The current detection circuit according to claim 1, comprising: a detection diode; a detection resistor; a first reset resistor and a second reset resistor as the reset elements; a reset diode; and a switch,
wherein a series connection circuit of the detection diode and the detection resistor is connected in parallel to the secondary side winding of the current transformer,
a parallel connection circuit of the switch and the first reset resistor, the second reset resistor, and the reset diode are connected in series, and the circuits are connected in parallel to the secondary side winding of the current transformer,
the detection diode is connected in a direction in which the detection diode conducts when the switching current flows in the predetermined direction,
the reset diode is connected in a direction in which the reset diode blocks conduction when the switching current flows in the predetermined direction,
the switch is set in a non-conducting state when the switching current is a current flowing in the predetermined direction, and
the switch is set in a conducting state when the switching current is also a current flowing in a direction opposite to the predetermined direction,
wherein the first reset resistor is the first resistor and the second reset resistor is the second resistor.

10. The current detection circuit according to claim 9, wherein a reset capacitor is connected in parallel to both ends of a series connection of the parallel connection circuit of the switch and the first reset resistor, and the second reset resistor.

11. The current detection circuit according to claim 1, comprising: a detection diode; a detection resistor; a first reset resistor and a discharge resistor as the reset elements; a reset capacitor; a reset diode; and a switch,
wherein a series connection circuit of the detection diode and the detection resistor is connected in parallel to the secondary side winding of the current transformer,
a first parallel connection circuit of a series connection circuit of the switch and the discharge resistor, and the reset diode, and a second parallel connection circuit of the first reset resistor and the reset capacitor are connected in series, and the series connection circuit is connected in parallel to the secondary side winding of the current transformer,
the detection diode is connected in a direction in which the detection diode conducts when the switching current flows in the predetermined direction,
the reset diode is connected in a direction in which the reset diode blocks conduction when the switching current flows in the predetermined direction,
the switch is set in a non-conducting state when the switching current is a current flowing in the predetermined direction, and
the switch is set in a conducting state when the switching current is also a current flowing in a direction opposite to the predetermined direction,
wherein the first reset resistor is the first resistor and the discharge resistor is the second resistor.

12. The current detection circuit according to claim 1, comprising a switch configured to switch the impedance,
wherein the switch is controlled using a signal different from that for a main switch through which the switching current flows.

13. The current detection circuit according to claim 1, comprising:
a switch configured to switch the impedance,
wherein the reset element includes a plurality of reset resistors and one or more reset capacitors,
wherein the plurality of reset resistors include the first resistor and the second resistor.

14. A power conversion device comprising:
a main circuit configured to supply an output voltage using the switching current; and
the current detection circuit according to claim 1.

15. A power system comprising the power conversion device according to claim 14.

\* \* \* \* \*